US012701830B2

(12) United States Patent
Lee et al.

(10) Patent No.: US 12,701,830 B2
(45) Date of Patent: Aug. 4, 2026

(54) LIGHT EMITTING ELEMENT, METHOD OF MANUFACTURING LIGHT EMITTING ELEMENT, AND METHOD OF MANUFACTURING DISPLAY DEVICE

(71) Applicant: Samsung Display Co., LTD., Yongin-si (KR)

(72) Inventors: Byung Ju Lee, Seoul (KR); Jin Wan Kim, Hwaseong-si (KR); Hoo Keun Park, Cheongju-si (KR); Young Jin Song, Asan-si (KR); Seung Geun Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 748 days.

(21) Appl. No.: 18/074,580

(22) Filed: Dec. 5, 2022

(65) Prior Publication Data

US 2023/0268464 A1 Aug. 24, 2023

(30) Foreign Application Priority Data

Feb. 22, 2022 (KR) ........................ 10-2022-0022811

(51) Int. Cl.
*H10H 20/831* (2025.01)
*H10H 20/01* (2025.01)
*H10H 20/825* (2025.01)

(52) U.S. Cl.
CPC .... *H10H 20/8312* (2025.01); *H10H 20/0137* (2025.01); *H10H 20/8252* (2025.01); *H10H 20/032* (2025.01)

(58) Field of Classification Search
None
See application file for complete search history.

(56) References Cited

U.S. PATENT DOCUMENTS 10,522,714 B2 * 12/2019 Shatalov ............... H01S 5/0234
11,302,747 B2 4/2022 Heo et al.
(Continued)

FOREIGN PATENT DOCUMENTS

KR 10-0580751 5/2006
KR 10-2011-0115322 A 10/2011
(Continued)

OTHER PUBLICATIONS

Huiyoun Shin et al., "Comparison of the Microstructural Characterizations of GaN Layers Grown on Si (111) and on Sapphire", Journal of the Korean Physical Society, Oct. 2013, pp. 1621-1624, vol. 63, No. 8.
(Continued)

*Primary Examiner* — Bilkis Jahan
(74) *Attorney, Agent, or Firm* — Womble Bond Dickinson (US) LLP

(57) ABSTRACT

A method of manufacturing a light emitting element, comprises placing a plurality of mask patterns on a substrate, forming first patterns on the substrate through the plurality of mask patterns, the first patterns recessed from an upper surface of the substrate, forming an undoped semiconductor layer on the substrate on which the first patterns are formed, etching the undoped semiconductor layer, forming a first semiconductor layer on the undoped semiconductor layer, forming an active layer on the first semiconductor layer, forming a second semiconductor layer on the active layer, and forming an electrode layer on the second semiconductor layer, wherein the undoped semiconductor layer includes second patterns recessed from a lower surface of the undoped semiconductor layer.

19 Claims, 20 Drawing Sheets

(56) References Cited

U.S. PATENT DOCUMENTS

| | | | |
|---|---|---|---|
| 11,749,709 B2 | 9/2023 | Heo et al. | |
| 2012/0080660 A1* | 4/2012 | Jung | F21K 9/23 |
| | | | 257/E33.066 |
| 2012/0223351 A1* | 9/2012 | Margalit | H10H 20/852 |
| | | | 257/98 |
| 2020/0227255 A1 | 7/2020 | Zhu et al. | |
| 2021/0057601 A1* | 2/2021 | Oliver | H10H 20/01335 |

FOREIGN PATENT DOCUMENTS

| | | |
|---|---|---|
| KR | 10-2012-0079308 A | 7/2012 |
| KR | 10-2013-0067149 A | 6/2013 |
| KR | 10-2014-0039071 | 3/2014 |
| KR | 10-2021-0065239 A | 6/2021 |

OTHER PUBLICATIONS

V.P. Kladko et al., "Influence of Dislocation Structure on Deformation Processes in AlGaN/GaN/(0001)Al2O3 Heterostructures", Ukrainian Journal of Physics, Sep. 2009, pp. 1014-1020, vol. 54, No. 10.

* cited by examiner

10

WLC1      WLC2      LTU

CF1   BS1 SCT1 WLS1   CF2   BS2 SCT2 WLS2   BS3 SCT3 CF3

ENC
PAS3
BK2
OC3
CAP2
BK1
CAP1
OC2

QPAS1
AE   ED   CE

PAS2
BNK2 } EML
BNK1
TFTL
BF
SUB

DEP

SE ACT GE DE      GI ILD      PAS1 OC1

TFT

| BA | LA1 | BA | LA2 | BA | LA3 | BA |

I      I'

EL: AE, ED, CE

DR3

LIGHT EMITTING ELEMENT, METHOD OF MANUFACTURING LIGHT EMITTING ELEMENT, AND METHOD OF MANUFACTURING DISPLAY DEVICE

CROSS-REFERENCE TO RELATED APPLICATION

This application claims priority to and benefits of Korean Patent Application No. 10-2022-0022811 under 35 U.S.C. § 119, filed in the Korean Intellectual Property Office on Feb. 22, 2022, the entire contents of which are incorporated herein by reference.

BACKGROUND

1. Technical Field

The disclosure relates to a light emitting element, a method of manufacturing a light emitting element, and a method of manufacturing a display device, which are capable of reducing strain in an active layer.

2. Description of the Related Art

The importance of display devices as communication media, has been emphasized because of the increasing developments of information technology. For example, the display devices have been used in various electronic devices such as smartphones, digital cameras, notebook computers, navigation devices, and smart-televisions. Examples of the display devices include flat panel display devices such as a liquid crystal display (LCD) device, a field emission display (FED) device, an organic light emitting display device, and the like. A light emitting display device of the flat panel display devices includes a light emitting element that enables each pixel of a display panel to emit light independently as a separate light source. Thus, the light emitting display device may display an image without a light emitting part that provides light to the display panel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a light emitting element in which strain of an active layer is reduced.

Embodiments also provide a method of manufacturing a light emitting element in which strain of an active layer is reduced.

Embodiments also provide a method of manufacturing a display device including a light emitting element in which strain of an active layer is reduced.

However, embodiments of the disclosure are not restricted to those set forth herein. The above and other embodiments will become more apparent to one of ordinary skill in the art to which the disclosure pertains by referencing the detailed description of the disclosure given below.

According to an embodiment of the disclosure, a method of manufacturing a light emitting element, comprises placing a plurality of mask patterns on a substrate, forming first patterns on the substrate through the plurality of mask patterns, the first patterns recessed from an upper surface of the substrate, forming an undoped semiconductor layer on the substrate on which the first patterns are formed, etching the undoped semiconductor layer, forming a first semiconductor layer on the undoped semiconductor layer, forming an active layer on the first semiconductor layer, forming a second semiconductor layer on the active layer, and forming an electrode layer on the second semiconductor layer, wherein the undoped semiconductor layer includes second patterns recessed from a lower surface of the undoped semiconductor layer.

Each of the first patterns may include a first surface coplanar with the upper surface of the substrate, a second surface facing the first surface, and a third surface extending between the first surface and the second surface.

A width of the first surface may be greater than a width of the second surface.

Each of the second patterns may include a fourth surface coplanar with the lower surface of the undoped semiconductor layer, a fifth surface facing the fourth surface, and a sixth surface extending between the fourth surface and the fifth surface.

A width of the fourth surface may be greater than a width of the fifth surface.

The width of the first surface may be greater than the width of the fourth surface.

After the etching of the undoped semiconductor layer, the width of the fourth surface of each of the second patterns may be greater than the width of the first surface.

The fifth surface may be removed by the etching of the undoped semiconductor layer.

The etching of the undoped semiconductor layer may be performed by wet etching.

An etchant for the wet etching may include potassium hydroxide or tetramethylammonium hydroxide.

The undoped semiconductor layer may include GaN and the first semiconductor layer includes n-GaN doped with Si.

The active layer may include InGaN.

A lattice constant of the active layer may be about 31.89 nm or greater.

According to an embodiment of the disclosure, a method of manufacturing a display device, comprises forming banks spaced apart from each other on a base substrate, forming, on the banks, a first electrode and a second electrode spaced apart from each other and overlapping the banks in a plan view, and placing a light emitting element between the first electrode and the second electrode, and manufacturing the light emitting element. The manufacturing of the light emitting element includes placing a plurality of mask patterns on a substrate, forming first patterns on the substrate through the plurality of mask patterns, the first patterns recessed from an upper surface of the substrate, forming an undoped semiconductor layer including second patterns recessed from a lower surface of the undoped semiconductor layer on the substrate on which the first patterns are formed, etching the undoped semiconductor layer, forming a first semiconductor layer on the undoped semiconductor layer, forming an active layer on the first semiconductor layer, forming a second semiconductor layer on the active layer, and forming an electrode layer on the second semiconductor layer.

The manufacturing of the light emitting element may further comprise placing a second mask pattern on the electrode layer, and etching the electrode layer, the second semiconductor layer, the active layer, and the first semiconductor layer through the second mask pattern.

The manufacturing of the light emitting element may further comprise after the etching of the electrode layer, the second semiconductor layer, the active layer, and the first semiconductor layer through the second mask pattern, forming an insulating layer on side surfaces of the electrode layer, the second semiconductor layer, the active layer, and the first semiconductor layer.

The etching of the undoped semiconductor layer may be performed by wet etching.

An etchant for the wet etching may include potassium hydroxide or tetramethylammonium hydroxide.

The undoped semiconductor layer may include GaN. The first semiconductor layer may include n-GaN doped with Si. The active layer may include InGaN. A lattice constant of the active layer may be about 31.89 nm or greater.

According to an embodiment of the disclosure, a light emitting element comprises a first semiconductor layer including n-GAN doped with n-type dopant, an active layer including InGaN on the first semiconductor layer, a second semiconductor layer including p-GaN doped with a p-type dopant, and disposed on the active layer, and an electrode layer on the second semiconductor layer, wherein a lattice constant of the first semiconductor layer is about 27.47 nm and a lattice constant of the active layer is about 31.89 nm.

It should be noted that the effects of the disclosure are not limited to those described above, and other effects of the disclosure will be apparent from the following description.

BRIEF DESCRIPTION OF THE DRAWINGS

An additional appreciation according to the embodiments of the disclosure will become more apparent by describing the embodiments thereof with reference to the accompanying drawings, wherein.

DETAILED DESCRIPTION OF THE EMBODIMENTS

Figure 1:
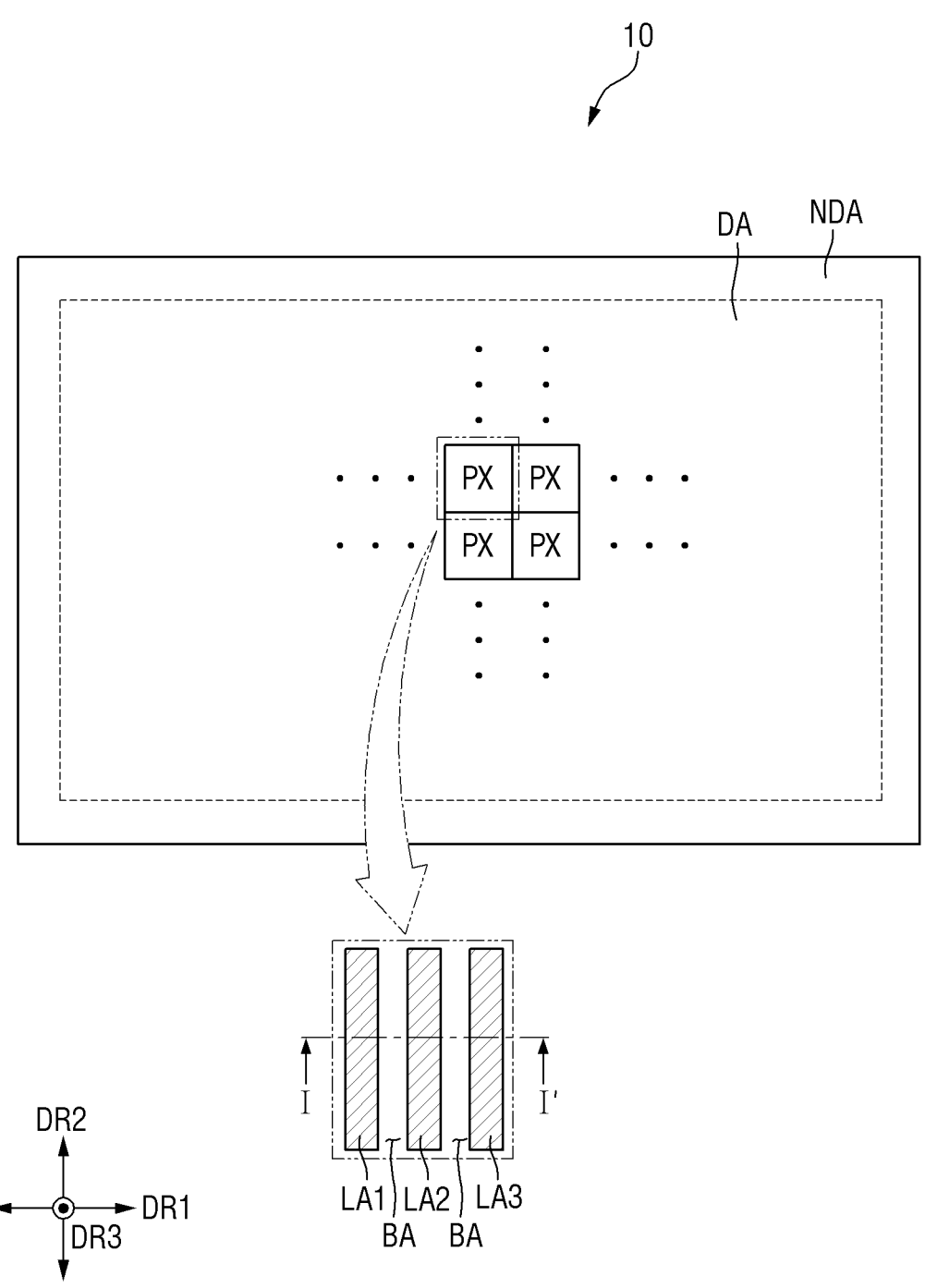
FIG. 1 is a schematic plan view of a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, like reference numerals denote like elements.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure. Similarly, the second element could also be termed the first element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic plan view of a display device according to an embodiment.

Referring to FIG. 1, a display device 10 according to an embodiment may have a rectangular shape in a plan view. However, the disclosure is not limited thereto, and the display device may have a square shape, a circular shape, an elliptical shape, or another polygonal shape in a plan view. Hereinafter, the display device may have the rectangular shape in a plan view.

The display device 10 may include a display panel that provides a display screen. Examples of the display panel may include an inorganic light emitting diode display panel, an organic light emitting display panel, a plasma display panel, a field emission display panel, and the like. Description of the inorganic light emitting diode display panel is provided below as an example of the display panel, but embodiments are not limited to the inorganic light emitting diode display device, and the disclosure may be applied to other display panels as long as the same technical spirit is applicable.

The display device may include a display area DA and a non-display area NDA. The display area DA may include pixels PX to display an image. The pixels PX may be arranged in a matrix form. The non-display area NDA may be disposed adjacent to (e.g., be disposed around) the display area DA to surround the display area DA, and may not display an image. The non-display area NDA may completely surround the display area DA in a plan view. The display area DA may be referred to as an active area and the non-display area NDA may be referred to as an inactive area. The display area DA may generally occupy a center of the display device.

The non-display area NDA may be located on each side (e.g., each long side) of the display area DA in a first direction and located on each side (e.g., each short side) of the display area DA in a second direction DR2. However, the embodiments are not limited thereto, and the non-display area NDA may be located only on a side and another side of the display area DA in the first direction DR1 or only on a side and another side of the display area DA in the second direction DR2. In each non-display area NDA, lines or circuit drivers included in the display device 10 may be disposed or external devices may be mounted.

Referring to the enlarged view shown in FIG. 1, each of the pixels PX of the display device 10 may have light emitting areas LA1, LA2, and LA3 defined by a pixel definition layer to emit light having a peak wavelength (e.g., a predetermined peak wavelength or selectable peak wavelength). For example, the display area DA of the display device 10 may include a first light emitting area LA1, a second light emitting area LA2, and a third light emitting area LA3. Each of the first to third light emitting areas LA1, LA2, and LA3 may be an area that emits light generated by a light emitting element of the display device 10 to the outside of the display device 10.

The first to third light emitting areas LA1, LA2, and LA3 may emit the light having the peak wavelength (e.g., the predetermined peak wavelength or selectable peak wavelength) to the outside of the display device 10. The first light emitting area LA1 may emit light of a first color, the second light emitting area LA2 may emit light of a second color, and the third light emitting area LA3 may emit light of a third color. For example, the light of the first color may be red light having a peak wavelength (or a single peak wavelength) in a range from about 610 nm to about 650 nm, the light of the second color may be green light having a peak wavelength (or a single peak wavelength) in a range from about 510 nm to about 550 nm, and the light of the third color may be blue light having a peak wavelength (or a single peak wavelength) in a range from about 440 nm to about 480 nm. However, the disclosure is not limited thereto.

The display area DA of the display device may include a light-blocking area located between every adjacent two of the light emitting areas LA1, LA2, and LA3. For example, the light-blocking area between the light emitting areas LA1, LA2, and LA3 may surround (or be adjacent to) the first to third light emitting areas LA1 to LA3.

Figure 2:
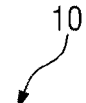
FIG. 2 is a schematic cross-sectional view taken along line I-I' of an enlarged view shown in FIG. 1.
Figure 2:

FIG. 2 is a schematic cross-sectional view taken along line I-I' of an enlarged view shown in FIG. 1.

Referring to FIG. 2, the display device 10 may include a base substrate SUB disposed over the display area DA and the non-display area NDA, a display element layer DEP on the base substrate SUB disposed in the display area DA, and an encapsulation member ENC disposed over the display area DA and the non-display area NDA and configured to seal the display element layer DEP.

The base substrate SUB may be made of an insulating material such as a polymer resin. The insulating material of the base substrate SUB may include, for example, polyimide (PI), but is not limited thereto.

The display element layer DEP may include a buffer layer BF, a thin film transistor layer TFTL, a light emitting element layer EML, a second planarization layer OC2, a first capping layer CAP1, a first light blocking member BK1, a first wavelength conversion part WLC1, a second wavelength conversion part WLC2, a light transmitting part LTU, a second capping layer CAP2, a third planarization layer OC3, a second light blocking member BK2, a first color filter CF1, a second color filter CF2, a third color filter CF3, a third passivation layer PAS3, and the encapsulation member ENC.

The buffer layer BF may be disposed on the base substrate SUB. The buffer layer BF may be made in the form of an inorganic film that is capable of protecting elements (e.g., the thin film transistor layer TFTL, the light emitting element layer EML, or the like) disposed thereon against air or water infiltration.

The thin film transistor layer TFTL may include thin film transistors TFT, a gate insulating layer GI, an interlayer dielectric layer ILD, a first passivation layer PAS1, and a first planarization layer OC1.

The thin film transistor TFT may be disposed on the buffer layer BF and may form a pixel circuit of each of the pixels PX.

A semiconductor layer ACT may be arranged on the buffer layer BF. The semiconductor layer ACT may overlap a gate electrode GE, a source electrode SE, and a drain electrode DE in a plan view, which are included in the thin film transistor TFT. The semiconductor layer ACT may be in direct contact with the source electrode SE and the drain electrode DE and face the gate electrode GE with the gate insulating layer GI interposed therebetween.

The gate electrode GE may be disposed above the gate insulating layer GI. The gate electrode GE may overlap the semiconductor layer ACT with the gate insulating layer GI interposed therebetween in a plan view.

The source electrode SE and the drain electrode DE may be spaced apart from each other on the interlayer dielectric layer ILD. The source electrode SE may be in contact with an end of the semiconductor layer ACT via a contact hole formed through the gate insulating layer GI and the interlayer dielectric layer ILD. The drain electrode DE may be in contact with another end of the semiconductor layer ACT via another contact hole formed through the gate insulating layer GI and the interlayer dielectric layer ILD. The drain electrode DE may be electrically connected to a first electrode AE of the light emitting element EL via a contact hole formed through the first passivation layer PAS1 and the first planarization layer OC1.

The gate insulating layer GI may be formed above the semiconductor layer ACT. For example, the gate insulating layer GI may be disposed on an upper surface of the semiconductor layer ACT and the buffer layer BF to electrically insulate the gate electrode GE from the semiconductor layer ACT. The gate insulating layer GI may include the contact hole through which the source electrode SE passes and the contact hole through which the drain electrode DE passes.

The interlayer dielectric layer ILD may be disposed above the gate electrode GE. For example, the interlayer dielectric layer ILD may include the contact hole through which the source electrode SE passes and the contact hole through which the drain electrode DE passes.

The first passivation layer PAS1 may be provided above the thin film transistor TFT and protect the thin film transistor TFT. For example, the first passivation layer PAS1 may include a contact hole through which the first electrode AE passes.

The first planarization layer OC1 may be provided above the first passivation layer PAS1 and planarize an upper end (or an upper surface) of the thin film transistor TFT. For example, the first planarization layer OC1 may include a contact hole through which the first electrode AE of a light emitting member EL passes.

The light emitting element layer EML may include the light emitting member EL, a first bank BNK1, a second bank BNK2, a first element insulating layer QPAS1, and a second passivation layer PAS2.

The light emitting member EL may be provided on the thin film transistor TFT. The light emitting member EL may include the first electrode AE, a second electrode CE, and a light emitting element ED.

The first electrode AE may be provided above the first planarization layer OC1. For example, the first electrode AE may be disposed on the first bank BNK1 arranged on the first planarization layer OC1 and cover the first bank BNK1. The first electrode AE may overlap one of the first to third light emitting areas LA1, LA2, and LA3 defined by the second bank BNK2 in a plan view. Also, the first electrode AE may be electrically connected to the drain electrode DE of the thin film transistor TFT.

The second electrode CE may be provided above the first planarization layer OC1. For example, the second electrode CE may be disposed on the first bank BNK1 arranged on the first planarization layer OC1 and cover the first bank BNK1. The second electrode CE may overlap one of the first to third light emitting areas LA1, LA2, and LA3 defined by the second bank BNK2 in a plan view. For example, the second electrode CE may receive a common voltage provided to all pixels.

The first element insulating layer QPAS1 may cover a portion of the first electrode AE and a portion of the second electrode CE adjacent to each other, and may electrically insulate the first electrode AE and the second electrode CE from each other.

The light emitting element ED may be disposed above the first planarization layer OC1 between the first electrode AE and the second electrode CE. The light emitting element ED may be disposed on the first element insulating layer QPAS1. An end of the light emitting element ED may be electrically connected to the first electrode AE and another end of the light emitting element ED may be electrically connected to the second electrode CE. For example, light emitting elements ED may include an active layer having a same material to emit light of a same wavelength or light of a same color. The light emitted from each of the first to third light emitting areas LA1, LA2, and LA3 may have a same color. For example, the light emitting elements ED may emit light of the third color or the blue light having the peak wavelength ranging from about 440 nm to about 480 nm.

The second bank BNK2 may be disposed on the first planarization layer OC1 to define the first to third light emitting areas LA1, LA2, and LA3. For example, the second bank BNK2 may be adjacent to (e.g., may surround) each of the first to third light emitting areas LA1, LA2, and LA3, but the disclosure is not limited thereto. The second bank BNK2 may be disposed in the light blocking area BA.

The second passivation layer PAS2 may be disposed on multiple light emitting members EL and the second bank BNK2. The second passivation layer PAS2 may cover the light emitting members EL, and may protect the light emitting members EL.

The display device 10 may further include the second planarization layer OC2, the first capping layer CAP1, the first light blocking member BK1, the first wavelength conversion part WLC1, the second wavelength conversion part WLC2, the light transmitting part LTU, the second capping layer CAP2, the third planarization layer OC3, the second light blocking member BK2, the first to third color filters CF1, CF2, and CF3, the third passivation layer PAS3, and the encapsulation member ENC.

The second planarization layer OC2 may be provided above the light emitting element layer EML and planarize an upper end (or an upper surface) of the light emitting element layer EML. The second planarization layer OC2 may include an organic material.

The first capping layer CAP1 may be disposed on the second planarization layer OC2. The first capping layer CAP1 may seal a bottom surface of the first and second wavelength conversion parts WLC1 and WLC2 and the light transmitting part LTU. The first capping layer CAP1 may include an inorganic material.

The first light blocking member BK1 may be disposed on the first capping layer CAP1 in the light blocking area BA. The first light blocking member BK1 may overlap the second bank BNK2 in a thickness direction (or in a third direction DR3). The first light blocking member BK1 may block the transmission of light.

The first light blocking member BK1 may include an organic light blocking material and a liquid repellent component.

The first light blocking member BK1 may include the liquid repellent component. Thus, the first and second wave-length conversion parts WLC1 and WLC2 and the light transmission part LTU may be separated into corresponding light emitting areas (e.g., the first to third light emitting areas LA1, LA2, and LA3).

The first wavelength conversion part WLC1 may be disposed on the first capping layer CAP1 in the first light emitting area LA1. The first wavelength conversion part WLC1 may be adjacent to (e.g., surrounded by) the first light blocking member BK1. The first wavelength conversion part WLC1 may include a first base resin BS1, a first scatterer SCT1, and a first wavelength shifter WLS1.

The first base resin BS1 may include a material having relatively high light transmittance. The first base resin BS1 may include a transparent organic material. For example, the first base resin BS1 may include at least one organic material of an epoxy-based resin, an acrylic-based resin, a cardo-based resin, and an imide-based resin.

The first scatterer SCT1 may have a refractive index different from that of the first base resin BS1 and may form an optical interface with the first base resin BS1.

The first wavelength shifter WLS1 may convert or shift the peak wavelength of incident light to a first peak wavelength. For example, the first wavelength shifter WLS1 may convert the blue light provided from the display device into the red light having the single peak wavelength ranging from about 610 nm to about 650 nm, and may emit the red light. The first wavelength shifter WLS1 may be (or may include) a quantum dot, a quantum rod, or a phosphor. The quantum dot may be a particulate material that emits light of a color (e.g., a specific color or selectable color) as electrons transition from a conduction band to a valence band.

The light emitted by the first wavelength shifter WLS1 may have a full width of half maximum (FWHM) of a light emission wavelength spectrum of about 45 nm or less, or about 40 nm or less, or about 30 nm or less. The color purity and color reproducibility of the color displayed by the display device 10 may be further improved.

A portion of the blue light provided from the light emitting element layer EML may pass through the first wavelength conversion part WLC1 without being converted into red light by the first wavelength shifter WLS1. Another portion of the blue light provided from the light emitting element layer EML, which is incident on the first color filter CF1 without being converted by the first wavelength conversion part WLC1, may be blocked by the first color filter CF1. Further, another portion of the blue light provided from the light emitting element layer EML of the display device 10, which is converted to red light by the first wavelength conversion part WLC1, may be transmitted to the outside through the first color filter CF1. Therefore, the first light emitting area LA1 may emit the red light.

The second wavelength conversion part WLC2 may be disposed on the first capping layer CAP1 in the second light emitting area LA2. The second wavelength conversion part WLC2 may be adjacent to (e.g., surrounded by) the first light blocking member BK1. The second wavelength conversion part WLC2 may include a second base resin BS2, a second scatterer SCT2, and a second wavelength shifter WLS2.

The second base resin BS2 may include a material having relatively high light transmittance. The second base resin BS2 may include a transparent organic material.

The second scatterer SCT1 may have a refractive index different from that of the second base resin BS2 and may form an optical interface with the second base resin BS2. For example, the second scatterer SCT2 may include a light scattering material or light scattering particles that scatter at least a part of transmitted light.

The second wavelength shifter WLS2 may convert or shift the peak wavelength of incident light to a second peak wavelength different from the first peak wavelength of the first wavelength shifter WLS1. For example, the second wavelength shifter WLS2 may convert the blue light provided from the display device into the green light having the single peak wavelength ranging from about 510 nm to about 550 nm, and may emit the green light. The second wavelength shifter WLS2 may be (or may include) a quantum dot, a quantum rod, or a phosphor. The second wavelength shifter WLS2 and the first wavelength shifter WLS1 may include a same material.

The light transmitting part LTU may be disposed on the first capping layer CAP1 in the third light emitting area LA3. The light transmitting part LTU may be adjacent to (e.g., surrounded by) the first light blocking member BK1. The light transmitting part LTU may maintain the peak wavelength of the incident light and transmit incident light. The light transmitting part LTU may include a third base resin BS3 and a third scatterer SCT3.

The third base resin BS3 may include a material having relatively high light transmittance. The third base resin BS3 may include a transparent organic material.

The third scatterer SCT3 may have a different refractive index from that of the third base resin BS3, and may form an optical interface with the third base resin BS3. For example, the third scatterer SCT3 may include a light scattering material or light scattering particles that scatter at least a part of transmitted light.

The first and second wavelength conversion parts WLC1 and WLC2 and the light transmitting part LTU may be disposed on the light emitting element layer EML through the second planarization layer OC2 and the first capping layer CAP1. Accordingly, the display device 10 may not require a separate substrate for the first and second wavelength conversion parts WLC1 and WLC2 and the light transmitting part LTU.

The second capping layer CAP2 may cover the first and second wavelength conversion parts WLC1 and WLC2, the light transmitting part LTU, and the first light blocking member BK1.

The third planarization layer OC3 may be disposed above the second capping layer CAP2 and planarize upper ends (or upper surfaces) of the first and second wavelength conversion parts WLC1 and WLC2 and the light transmitting part LTU. The third planarization layer OC3 may include an organic material.

The second light blocking member BK2 may be disposed on the third planarization layer OC3 in the light blocking area BA. The second light blocking member BK2 may overlap the first light blocking member BK1 or the second bank BNK2 in the thickness direction. The second light blocking member BK2 may block the transmission of light.

The first color filter CF1 may be disposed on the third planarization layer OC3 in the first light emitting area LA1. The first color filter CF1 may be adjacent to (e.g., surrounded by) the second light blocking member BK2. The first color filter CF1 may overlap the first wavelength conversion part WLC1 in the thickness direction. The first color filter CF1 may selectively transmit light of a first color (e.g., red light), and may block or absorb light of a second color (e.g., green light) and light of a third color (e.g., blue light).

The second color filter CF2 may be disposed on the third planarization layer OC3 in the second light emitting area LA2. The second color filter CF2 may be adjacent to (e.g., surrounded by) the second light blocking member BK2. The second color filter CF2 may overlap the second wavelength conversion part WLC2 in the thickness direction. The second color filter CF2 may selectively transmit light of a second color (e.g., green light), and may block or absorb light of a first color (e.g., red light) and light of a third color (e.g., blue light).

The third color filter CF3 may be disposed on the third planarization layer OC3 in the third light emitting area LA3. The third color filter CF3 may be adjacent to (e.g., surrounded by) the second light blocking member BK2. The third color filter CF3 may overlap the light transmitting part LTU in the thickness direction. The third color filter CF2 may selectively transmit light of a third color (e.g., blue light), and may block or absorb light of a first color (e.g., red light) and light of a second color (e.g., green light).

The first to third color filters CF1, CF2, and CF3 may absorb a part of light entering from the outside of the display device 10 and reduce reflected light due to external light. Therefore, the first to third color filters CF1, CF2, and CF3 may prevent or reduce color distortion due to external light reflection.

The third passivation layer PAS3 may cover the first to third color filters CF1, CF2, and CF3. The third passivation layer PAS3 may protect the first to third color filters CF1, CF2, and CF3.

The encapsulation member ENC may be disposed on the third passivation layer PAS3. For example, the encapsulation member ENC may include at least one inorganic film and prevent infiltration of oxygen or moisture. Also, the encapsulation member ENC may include at least one organic film and protect the display device against foreign substances such as dust.

Figure 3:
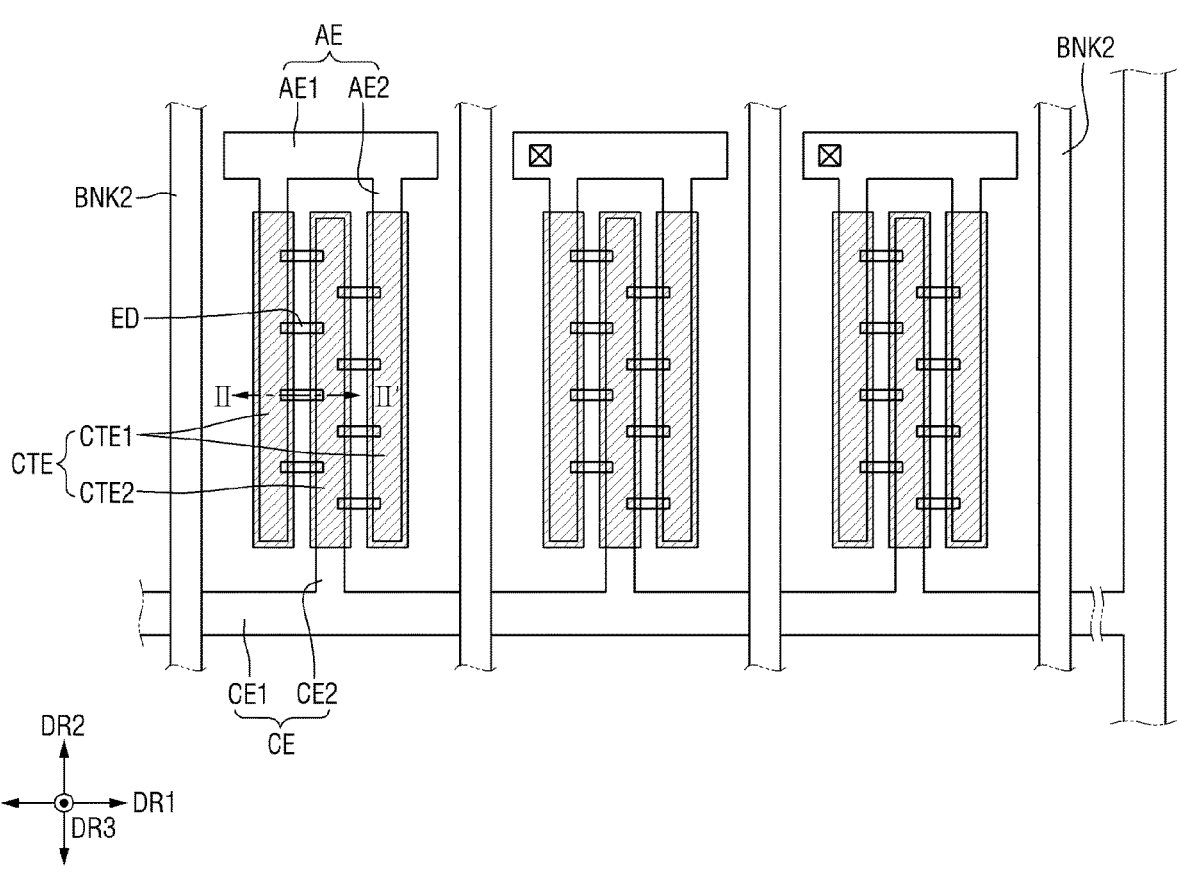
FIG. 3 is a schematic plan view of a pixel of a display device according to an embodiment.
Figure 4:
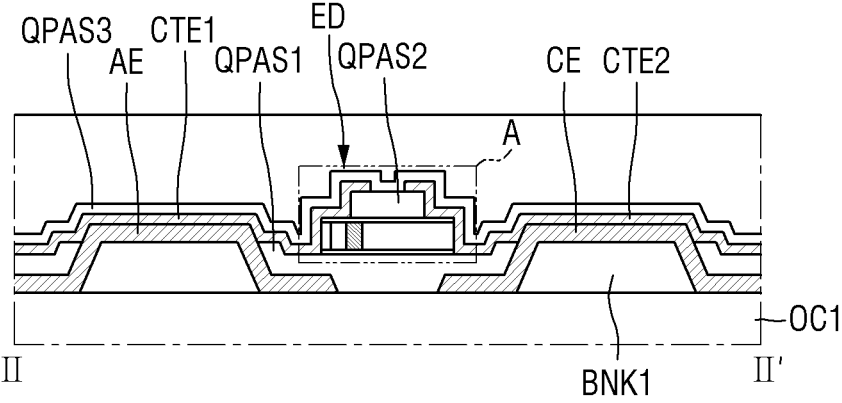
FIG. 4 is a schematic cross-sectional view taken along line II-II' of FIG. 3.

FIG. 3 is a schematic plan view of a pixel of a display device according to an embodiment. FIG. 4 is a schematic cross-sectional view taken along line II-II' of FIG. 3.

Referring to FIGS. 2 to 4, each of the pixels PX may include a first sub-pixel, a second sub-pixel, and a third sub-pixel. The first to third sub-pixels may correspond to the first to third light emitting areas LA1, LA2, and LA3, respectively. The light emitting elements ED of the first to third sub-pixels may emit light through the first to third light emitting areas LA1, LA2, and LA3, respectively.

Each of the first to third sub-pixels may emit light of a same color. For example, each of the first to third sub-pixels may include light emitting elements ED of a same type, and may emit light of a third color or blue light. In other embodiments, the first sub-pixel may emit light of a first color or red light, the second sub-pixel may emit light of a second color or green light, and the third sub-pixel may emit light of the third color or the blue light.

Each of the first to third sub-pixels may include first and second electrodes AE and CE, the light emitting element ED (or the light emitting elements ED), contact electrodes CTE, and second banks BNK2.

The first and second electrodes AE and CE may be electrically connected to the light emitting element ED and receive a voltage, and the light emitting element ED may emit light of a wavelength band (e.g., a specific wavelength band or selectable wavelength band). At least a part of the first electrode AE and at least a part of the second electrode CE may form an electric field in the pixel PX (or in the sub-pixel), and the light emitting elements ED may be aligned by the electric field.

For example, the first electrode AE may be a pixel electrode separated for each of the first to third sub-pixels, and the second electrode CE may be a common electrode commonly connected to the first to third sub-pixels. Any one of the first electrode AE and the second electrode CE may be an anode electrode of the light emitting element ED, and another thereof may be a cathode electrode of the light emitting element ED. For example, the one of the first electrode AE and the second electrode CE may be electrically connected to the anode electrode of the light emitting element ED through a first contact electrode CTE1, and the another thereof may be electrically connected to the cathode electrode of the light emitting element ED through a second contact electrode CTE2.

The first electrode AE may include a first electrode stem portion AE1 and at least one first electrode branch portion AE2. The first electrode stem portion AE1 may extend in the first direction DR1, and the at least one first electrode branch portion AE2 may branch out from the first electrode stem portion AE1 and extend in the second direction DR2.

The first electrode stem portion AE1 of each of the first to third sub-pixels may be spaced apart from a first electrode stem portion AE1 of an adjacent sub-pixel, and may be disposed on a virtual extension line of the first electrode stem portion AE1 of the adjacent sub-pixel adjacent in the first direction DR1. The first electrode stem portions AE1 of the first to third sub-pixels may receive different signals from each other, and may be independently driven.

The first electrode branch portion AE2 may branch out from the first electrode stem portion AE1 and extend in the second direction DR2. An end of the first electrode branch portion AE2 may be electrically connected to the first electrode stem portion AE1, and another end of the first electrode branch portion AE2 may be spaced apart from the second electrode stem portion CE1 facing the first electrode stem portion AE1.

The second electrode CE may include a second electrode stem portion CE1 and a second electrode branch portion CE2. The first electrode stem portion CE1 may extend in the first direction DR1. The second electrode branch portion CE2 may branch out from the second electrode stem portion CE1 and extend in the second direction DR2. The second electrode stem portion CE1 of each of the first to third sub-pixels may be electrically connected to the second electrode stem portion CE1 of the adjacent sub-pixel. The second electrode stem portion CE1 may extend in the first direction DR1 and traverse the pixels PX. The second electrode stem portion CE1 may be electrically connected to an outer portion of the display area DA or a portion extending from the non-display area NDA in a direction.

The second electrode branch portion CE2 may be spaced apart from the first electrode branch portion AE2 and face the first electrode branch portion AE2. An end of the second electrode branch portion CE2 may be electrically connected to the second electrode stem portion CE1, and another end of the second electrode branch portion CE2 may be spaced apart from the first electrode stem portion AE1.

The first electrode AE may be electrically connected to the thin film transistor layer TFTL of the display device 10 through a first contact hole CNT1, and the second electrode CE may be electrically connected to the thin film transistor layer TFTL of the display device through a second contact hole CNT2. For example, the first contact hole CNT1 may be disposed in each of the first electrode stem portions AE1, and the second contact hole CNT2 may be disposed in the second electrode stem portion CE1, but the disclosure is not limited thereto.

The second bank BNK2 may be disposed at a boundary between the pixels PX. The first electrode stem portions AE1 may be spaced apart from each other based on the second bank BNK2. The second bank BNK2 may extend in the second direction DR2, and may be disposed at a boundary of pixels PX arranged in the first direction DR1. The second bank BNK2 may also be arranged at a boundary of pixels PX arranged in the second direction DR2. The second bank BNK2 may define the boundary of the pixels PX.

The second bank BNK2 may prevent ink from overflowing the boundary of the pixels PX during ejection of the ink in which the light emitting elements ED are dispersed in the process of manufacturing the display device 10. The second bank BNK2 may separate the ink in which different light emitting elements ED are dispersed, and the ink may not be mixed with each other.

The light emitting element ED may be disposed between the first electrode AE and the second electrode CE. The end of the light emitting element ED may be electrically connected to the first electrode AE, and the another end of the light emitting element ED may be electrically connected to the second electrode CE.

The light emitting elements ED may be spaced apart from each other, and may be aligned to be substantially parallel to each other. A distance between the light emitting elements ED is not limited thereto.

The light emitting elements ED may include an active layer having a same material to emit light of a same wavelength band or light of a same color. The first to third sub-pixels may emit the light of the same color. For example, the light emitting elements ED may emit the light of the third color or the blue light having the peak wavelength ranging from about 440 nm to about 480 nm.

The contact electrode CTE may include the first and second contact electrodes CTE1 and CTE2. The first contact electrode CTE1 may cover a part of the first electrode branch portion AE2 and a part of the light emitting element ED, and may electrically connect the first electrode branch portion AE2 and the light emitting element ED. The second contact electrode CTE2 may cover a part of the second electrode branch portion CE2 and another part of the light emitting element ED, and may electrically connect the second electrode branch portion CE2 and the light emitting element ED.

The first contact electrode CTE1 may be disposed on the first electrode branch portion AE2 and extend in the second direction DR2. The first contact electrode CTE1 may be in contact with the end of the light emitting element ED. The light emitting element ED may be electrically connected to the first electrode AE through the first contact electrode CTE1.

The second contact electrode CTE2 may be disposed on the second electrode branch CE2 and extend in the second direction DR2. The second contact electrode CTE2 may be spaced apart from the first contact electrode CTE1 in the first direction DR1. The second contact electrode CTE2 may be in contact with the another end of the light emitting element ED. The light emitting element ED may be electrically connected to the second electrode CE through the second contact electrode CTE2.

The light emitting element layer EML of the display device 10 may be disposed on the thin film transistor layer TFTL and may include a first insulating layer QPAS1, a second insulating layer QPAS2, and a third element insulating layer QPAS3.

Multiple first banks BNK1 may be disposed in each of the first to third light emitting areas LA1, LA2, and LA3. Each of the first banks BNK1 may correspond to the first electrode AE or the second electrode CE. Each of the first and second electrodes AE and CE may be disposed on a corresponding first bank BNK1. For example, the first banks BNK1 may be disposed on the first planarization layer OC1, and a side surface of each of the first banks BNK1 may be inclined from the first planarization layer OC1. The inclined side surface of the first bank BNK1 may reflect light emitted from the light emitting element ED.

The first electrode stem portion AE1 may include the first contact hole CNT1 penetrating the first planarization layer OC1. The first electrode stem portion AE1 may be electrically connected to the thin film transistor TFT through the first contact hole CNT1.

The second electrode stem portion CE1 may extend in the first direction DR1, and may also be disposed even in the non-light emitting area in which the light emitting element ED is not disposed. For example, the second electrode stem portion CE1 may be disposed the first to third light emitting areas LA1, LA2, and LA3 and the non-light emitting area. The second electrode stem portion CE1 may include the second contact hole CNT2 penetrating the first planarization layer OC1. The second electrode stem portion CE1 may be electrically connected to a power electrode through the second contact hole CNT2. The second electrode CE may receive an electrical signal from the power electrode.

The first and second electrodes AE and CE may include a transparent conductive material. The first and second electrodes AE and CE may include a conductive material having high reflectance. The first and second electrodes AE and CE may have a structure in which a transparent conductive material and a metal having high reflectance are stacked in one or more layers. In other embodiments, the first and second electrodes AE and CE may be formed as a single layer including the transparent conductive material or the metal having high reflectance.

The first element insulating layer QPAS1 may be disposed on the first planarization layer OC1, the first electrode AE, and the second electrode CE. The first element insulating layer QPAS1 may cover a part of each of the first and second electrodes AE and CE.

The first element insulating layer QPAS1 may protect the first and second electrodes AE and CE, and electrically insulate the first and second electrodes AE and CE from each other. The first element insulating layer QPAS1 may prevent the light emitting element ED from being damaged by making a direct contact with other members.

The light emitting element ED may be disposed between the first electrode AE and the second electrode CE on the first element insulating layer QPAS1. The end of the light emitting element ED may be electrically connected to the first electrode AE. The another end of the light emitting element ED may be electrically connected to the second electrode CE.

The second element insulating layer QPAS2 may be partially disposed on the light emitting element ED disposed between the first and second electrodes AE and CE. The second element insulating layer QPAS2 may be disposed at a center portion of an upper surface of the light emitting element ED. The second element insulating layer QPAS2 may partially cover an outer surface of the light emitting element ED. The third element insulating layer QPAS3 may protect the light emitting element ED. The third element insulating layer QPAS3 may cover the outer surface of the light emitting element ED.

The contact electrode CTE may include first and second contact electrodes CTE1 and CTE2. The first contact electrode CTE1 may cover a part of the first electrode branch portion AE2 and a part of the light emitting element ED, and may electrically connect the first electrode branch portion AE2 and the light emitting element ED. The second contact electrode CTE2 may cover a part of the second electrode branch portion CE2 and another part of the light emitting element ED, and may electrically connect the second electrode branch portion CE2 and the light emitting element ED.

The first contact electrode CTE1 may be disposed on the first electrode branch portion AE2 and extend in the second direction DR2. The first contact electrode CTE1 may be in contact with the end of the light emitting element ED. The light emitting element ED may be electrically connected to the first electrode AE through the first contact electrode CTE1.

The first contact electrode CTE1 may be in contact with an end side of an upper surface of the second element insulating layer QPAS2.

The second contact electrode CTE2 may be disposed on the second electrode branch CE2 and extend in the second direction DR2. The second contact electrode CTE2 may be spaced apart from the first contact electrode CTE1 in the first direction DR1. The second contact electrode CTE2 may be in contact with the another end of the light emitting element ED. The light emitting element ED may be electrically connected to the second electrode CE through the second contact electrode CTE2.

The second contact electrode CTE2 may be in contact with another end side of the upper surface of the second element insulating layer QPAS2.

The first contact electrode CTE1 and the second contact electrode CTE2 may be disposed in (or may be formed from) a same layer. Each of the first contact electrode CTE1 and the second contact electrode CTE2 may expose a center portion of the upper surface of the second element insulating layer QPAS2.

Each of the first contact electrode CTE1 and the second contact electrode CTE2 may include a conductive material. The first contact electrode CTE1 may include a first material, and the second contact electrode CTE2 may include a second material. However, the first material and the second material may have different physical properties from each other. Detailed description thereof is provided below.

Figure 5:
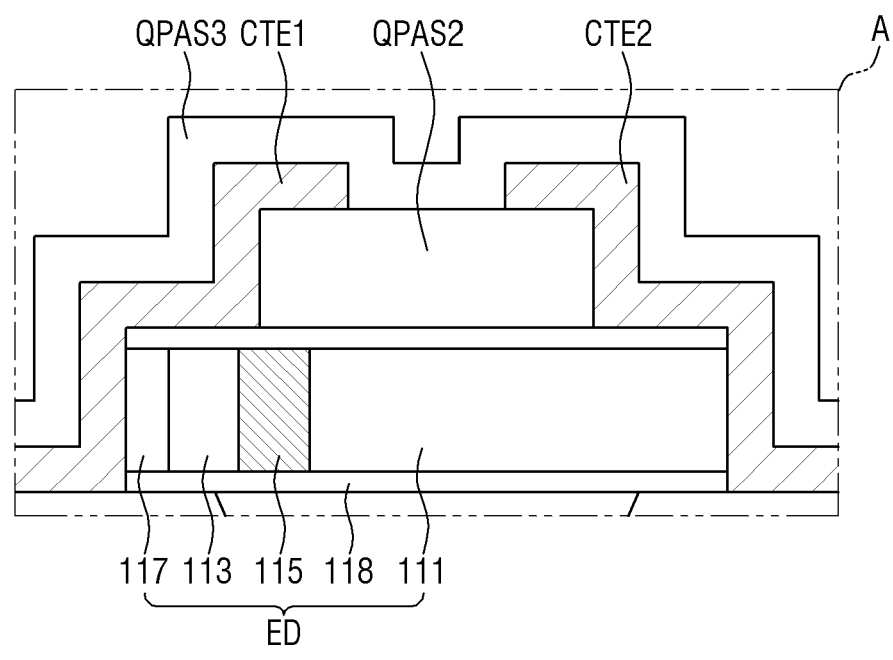
FIG. 5 is a schematic enlarged cross-sectional view of portion A of FIG. 4.

FIG. 5 is a schematic enlarged cross-sectional view of portion A of FIG. 4.

Referring to FIG. 5, the light emitting element ED may be a light emitting diode. For example, the light emitting element ED may have a size of a micrometer scale or nanometer scale, and may be an inorganic light emitting diode including an inorganic material. The inorganic light emitting diode of the light emitting element ED may be aligned between two electrodes (e.g., the first and second electrodes AE and CE of FIG. 4) according to an electric field formed in a direction between the two electrodes facing each other.

The light emitting element ED may have a shape extending in a direction. The light emitting element ED may have a shape of a rod, a wire, a tube, or the like. The light emitting element ED may include a first semiconductor layer 111, a second semiconductor layer 113, an active layer 115, an electrode layer 117, and an insulating layer 118. For example, a length of the light emitting element ED may be about 4 μm.

The first semiconductor layer 111 of the light emitting element ED may include an n-type semiconductor. The first semiconductor layer 111 may include a semiconductor material having the formula $Al_xGa_yIn_{1-x-y}N$ ($0 \leq x \leq 1$, $0 \leq y \leq 1$, $0 \leq x+y \leq 1$). For example, the first semiconductor layer 111 may include at least one semiconductor material of AlGaInN, GaN, AlGaN, InGaN, AlN, and InN, which are doped with an n-type dopant. The first semiconductor layer 111 may be doped with an n-type dopant such as Si, Ge, or Sn. For example, the first semiconductor layer 111 may include n-GaN doped with Si, which is an n-type dopant. A length of the first semiconductor layer 111 may be in a range of 500 about μm to 1 about μm, but is not limited thereto.

The second semiconductor layer 113 of the light emitting element ED may include a p-type semiconductor, and may include a semiconductor material having the formula $Al_xGa_yIn_{1-x-y}N$ ($0 \leq x \leq 1$, $0 \leq y \leq 1$, $0 \leq x+y \leq 1$). For example, the second semiconductor layer 113 may include at least one semiconductor material of AlGaInN, GaN, AlGaN, InGaN, AlN, and InN, which are doped with a p-type dopant. The second semiconductor layer 113 may be doped with a p-type dopant such as Mg, Zn, Ca, Se, or Ba. For example, the second semiconductor layer 113 may include p-GaN doped with Mg, which is a p-type dopant. A length of the second semiconductor layer 113 may be in a range of 30 about μm to 200 about μm.

The active layer 115 of the light emitting element ED may be disposed between the first and second semiconductor layers 111 and 113. Electron-hole pairs according to light emission signals applied through the first and second semiconductor layers 111 and 113 may be re-coupled, and the active layer 115 may emit light. The active layer 115 may include a material having a single or multiple quantum well structure. When the active layer 115 includes the material having the multiple quantum well structure, quantum layers and well layers may be alternately stacked each other. For example, the active layer 115 may have a structure in which semiconductor materials having large band gap energy and semiconductor materials having small band gap energy are alternately stacked each other, and may include group III to group V semiconductor materials according to a wavelength band of the emitted light. The active layer 115 may include at least one material of AlGaInN, GaN, AlGaN, InGaN, AlN, and InN. In an embodiment, the active layer 115 may include InGaN.

Although not illustrated, a supperlattice layer may be further disposed between the active layer 115 and the first semiconductor layer 111. The superlattice layer may alleviate stress, which may be caused due to a difference in lattice constants between the first semiconductor layer 111 and the active layer 115. For example, the superlattice layer may be formed of InGaN or GaN. A length of the superlattice layer may be in a range of about 50 nm to about 200 nm.

According to an embodiment, some light emitting elements ED of the display device 10 may have different active layers 115 from each other and emit light of different colors. For example, the active layer 115 of the light emitting element ED in the first light emitting area LA1 may emit the red light, which is the light of the first color. The active layer 115 of the light emitting element ED in the second light emitting area LA2 may emit the green light, which is the light of the second color. The active layer 115 of the light emitting element ED in the third light emitting area LA3 may emit the blue light, which is the light of the third color. Each of the light emitting element ED in the first light emitting area LA1, the light emitting element ED in the second light emitting area LA2, and the light emitting element ED in the third light emitting area LA3 may have different concentration of the dopant doped in the first semiconductor layer 111, the active layer 115, and the second semiconductor layer 113, or may have different 'x' and/or 'y' values in the formula $Al_xGa_yIn_{1-x-y}N$ ($0 \leq x \leq 1$, $0 \leq y \leq 1$, $0 \leq x+y \leq 1$).

For example, when the active layer 115 includes InGaN, the color of the light emitted by each active layer 115 may vary according to the content of indium (In). For example, as the content of indium (In) increases, the wavelength band of the light emitted by the active layer may move or shift to a red wavelength side. In contrast, as the content of indium (In) is reduced, the wavelength band of the light emitted by the active layer may move or shift to a blue wavelength side. Therefore, the content of indium (In) in the active layer 115 of the light emitting element ED in the first light emitting area LA1 may be higher than the content of indium (In) in each of the active layer 115 of the light emitting element ED in the second light emitting area LA2 and the active layer 115 of the light emitting element ED in the third light emitting area LA3. Also, the content of indium (In) in the active layer 115 of the light emitting element ED of the second light emitting area LA2 may be higher than the content of indium (In) in the active layer 115 of the light emitting element ED in the third light emitting area LA3.

For example, the content of indium (In) in the active layer 115 of the light emitting element ED in the third light emitting area LA3 may be about 15%. The content of indium (In) in the active layer 115 of the light emitting element ED in the second light emitting area LA2 may be about 25%. The content of indium (In) in the active layer 115 of the light emitting element ED in the first light emitting area LA1 may be about 35% or greater. For example, the content of indium (In) in the active layer 115 may be adjusted, and the light emitting element ED may emit light of a different color.

As the content of indium (In) in the active layer 115 is higher, the defect density and/or stress inside the active layer 115 may be increased, and aggregation of indium (In) may occur. Thus, luminous efficiency may be reduced. For example, since the content of indium in the active layer 115 of the light emitting element ED in the first light emitting area LA1 is about 35% or greater, the defect density and/or stress inside the active layer 115 may be increased and aggregation of indium (In) may be more likely to occur. Thus, the light emitting element of the display device according to an embodiment may have a separate strain relaxed layer capable of reducing strain of the active layer 115. Therefore, the reduction of luminous efficiency due to the increase of the defect density and/or stress inside the active layer 115 and the occurrence of aggregation of indium (In) may be prevented although the content of indium (In) in the active layer 115 is increased.

Description of a method of manufacturing a display device according to an embodiment is provided below.

Hereinafter, detailed description of a method of manufacturing a display device is provided with reference to FIGS. 6 to 16 in conjunction with FIGS. 1 to 5.

Referring to FIG. 2, a method of manufacturing a display device 10 according to an embodiment may include forming the first banks BNK1 spaced apart from each other on the base substrate SUB, forming the first electrode AE and the second electrode CE which are spaced apart from each other and cover the first banks BNK1, and placing the light emitting element ED between the first electrode AE and the second electrode CE.

The placing of the light emitting element ED may include forming the light emitting element ED and jetting (e.g., ink-jetting) the light emitting element ED between the first electrode AE and the second electrode CE.

FIGS. 6 to 16 are schematic cross-sectional views illustrating a process of manufacturing a light emitting element according to an embodiment. Detailed description of a process of forming the light emitting element ED is provided with reference to FIGS. 6 to 16.

Figure 6:
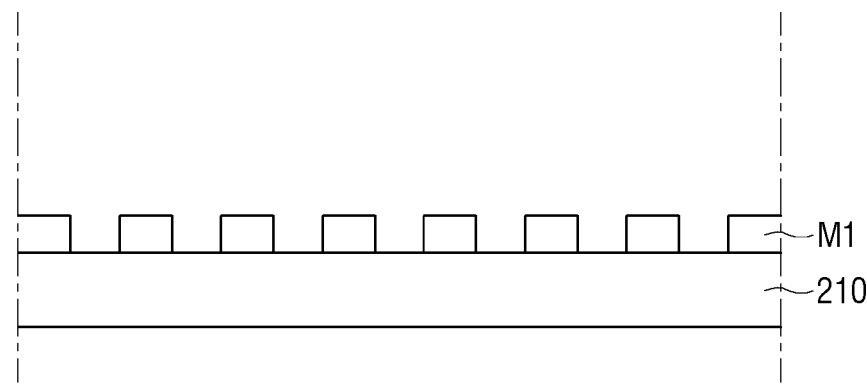
FIGS. 6 to 16 are schematic cross-sectional views illustrating a process of manufacturing a light emitting element according to an embodiment.

As shown in FIG. 6, first mask patterns M1 may be disposed on a substrate 210. The substrate 210 may be a sapphire (Al2O3) substrate or a silicon wafer containing silicon. However, the disclosure is not limited thereto, and the substrate 210 may be a semiconductor substrate, such as a GaAs substrate. Hereinafter, a description of the substrate 210 having the sapphire substrate is provided below.

The first mask patterns M1 may include an organic insulating material or an inorganic insulating material. Examples of the organic insulating material of the first mask patterns M1 may include photoresist (PR), and examples of the inorganic insulating material may include silicon oxide (SiO$_x$) or silicon nitride (SiN$_x$). However, the disclosure is not limited thereto.

The first mask patterns M1 may be spaced apart from each other.

Figure 7:
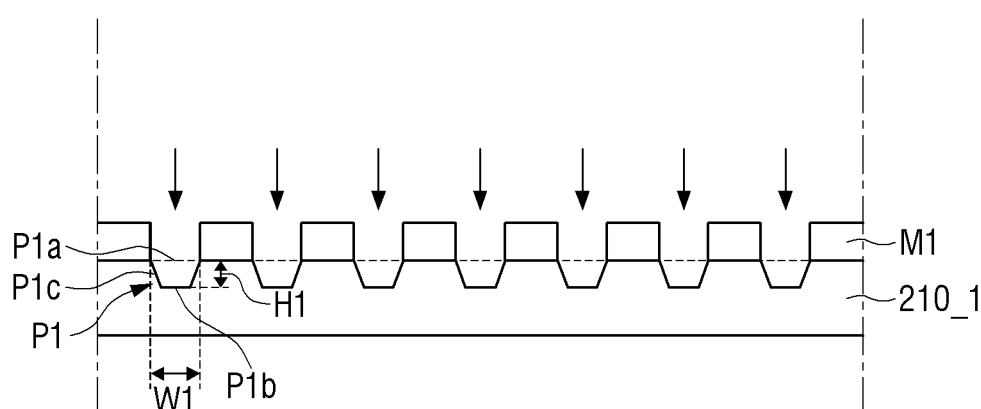

As shown in FIG. 7, first patterns P1 recessed from an upper surface of the substrate 210_1 are formed on the substrate 210_1 through the first mask patterns M1. The first patterns P1 may be formed by an etching process. The etching process may be dry etching or wet etching.

The first patterns P1 may each include a first surface P1a, a second surface P1b, and a third surface P1c. The first surface P1a may be coplanar with the upper surface of the substrate 210. The second surface P1b may face the first surface P1a. The third surface P1c may extend between the first surface P1a and the second surface P1b. A width W1 of the first surface P1a may be greater than a width of the second surface P1b. For example, the first pattern P1 may each have an inverted trapezoid cross-section.

Figure 8:
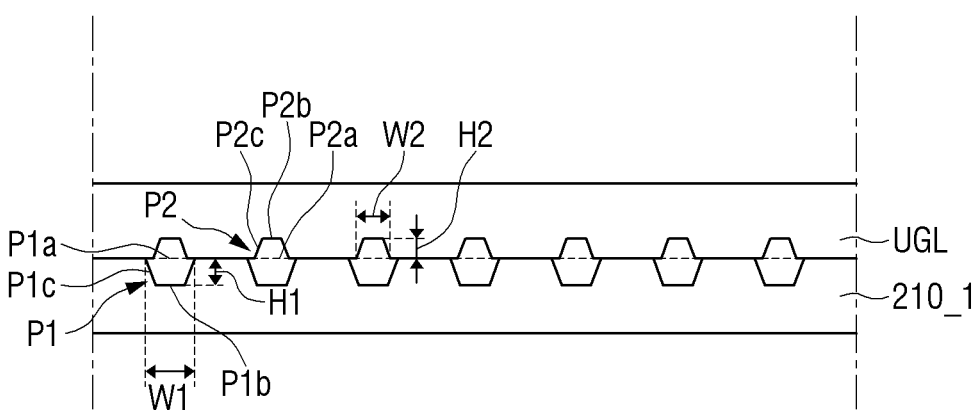

As shown in FIG. 8, an undoped semiconductor layer UGL including second patterns P2 recessed from a lower surface thereof may be formed on the substrate 210_1 on which the first patterns P1 are formed. The undoped semiconductor layer UGL may include at least one material of AlGaInN, GaN, AlGaN, InGaN, AlN, and InN. For example, the undoped semiconductor layer UGL may include GaN.

The second patterns P2 may each include a fourth surface P2a, a fifth surface P2b, and a sixth surface P2c. The fourth surface P2a may be coplanar with the lower surface of the undoped semiconductor layer UGL. The fifth surface P2b may face the fourth surface P2a. The sixth surface P2c may extend between the fourth surface P2a and the fifth surface P2b. A width W2 of the fourth surface P2a may be greater than a width of the fifth surface P2b. For example, the second patterns P2 may each have a trapezoid cross-section.

The width W2 of the fourth surface P2a may be smaller than the width W1 of the first surface P1a. Accordingly, the lower surface of the undoped semiconductor layer UGL may partially overlap the third surfaces P1c of the first patterns P1 in the thickness direction.

A height H1 of the first patterns P1 is shown in FIG. 7 and a height H2 of the second patterns P2 is shown in FIG. 8. The height H1 of the first patterns P1 and the height H2 of the second patterns P2 may be the same, but the disclosure is not limited thereto. In other embodiments, the height H1 of the first patterns P1 may be greater than or less than the height H2 of the second patterns P2.

Figure 9:
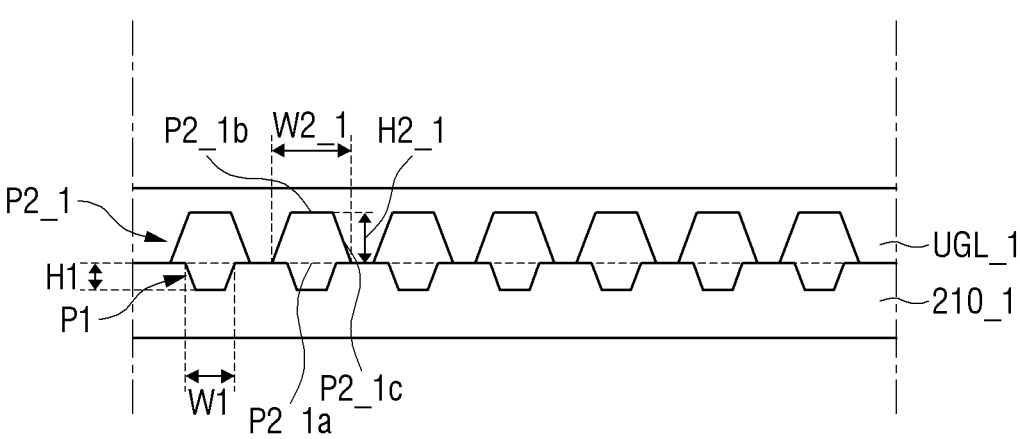

As shown in FIG. 9, the undoped semiconductor layer UGL (e.g., refer to FIG. 8) may be etched to form an undoped semiconductor layer UGL_1 (or a formed undoped semiconductor layer UGL_1). By etching the undoped semiconductor layer UGL, a width W2_1 of fourth surfaces P2_1a of second patterns P2_1 may become greater than the width W1 of the first surfaces P1a. The undoped semiconductor layer UGL may be etched by wet etching. An etchant for the wet etching may include potassium hydroxide or tetramethylammonium hydroxide, but is not limited thereto. In the wet etching process, as shown in FIG. 8, the etchant may selectively etch the undoped semiconductor layer UGL in a direction from the fourth surface P2a of the second pattern P2 toward the fifth surface P2b and in a direction perpendicular to the sixth surface P2c and directed towards an inside of the undoped semiconductor UGL from the second pattern P2.

Figure 10:
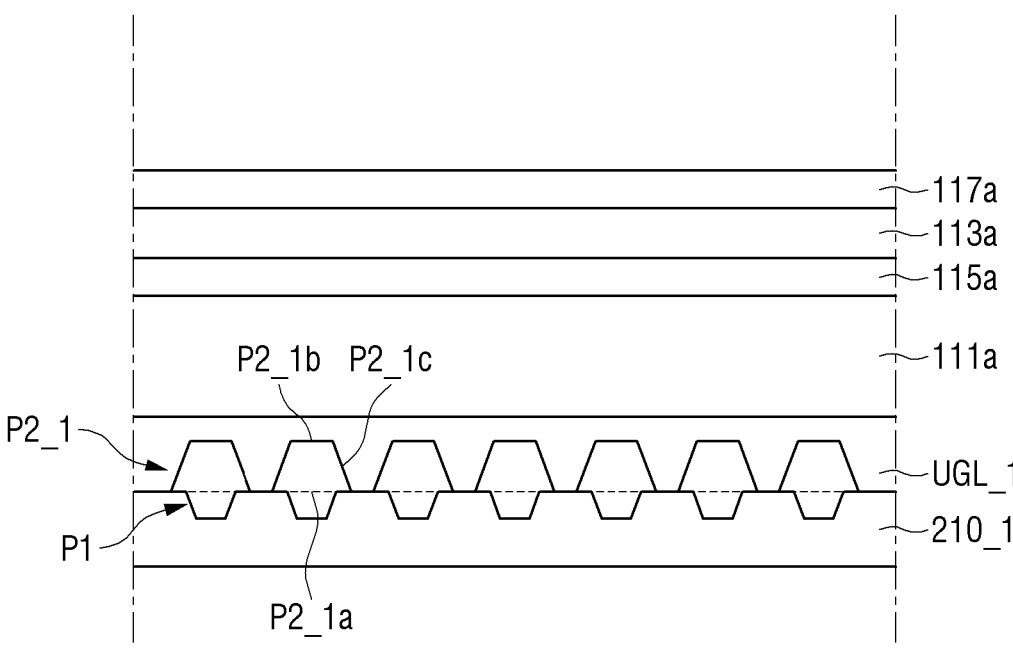

As shown in FIG. 10, a first semiconductor layer 111a may be formed on the undoped semiconductor layer UGL_1. An active layer 115a may be formed on the first semiconductor layer 111a. A second semiconductor layer 113a may be formed on the active layer 115a. An electrode layer 117a may be formed on the second semiconductor layer 113a.

The first semiconductor layer 111a, the active layer 115a, the second semiconductor layer 113a, and the electrode layer 117a may respectively have the same material as the first semiconductor layer 111, the active layer 115, the second semiconductor layer 113, and the electrode layer 117 of FIG. 5. Thus, detailed descriptions thereof is omitted.

As described above, the strain relaxed layer may be separately formed, and the reduction of luminous efficiency due to an increase of the defect density and/or stress inside the active layer 115 and the occurrence of aggregation of indium (In) may be prevented even when the content of indium (In) in the active layer 115 is increased.

According to an embodiment, the strain relaxed layer may be the undoped semiconductor layer UGL_1 of FIG. 9. The substrate 210_1, the undoped semiconductor layer UGL_1, the first semiconductor layer 111a, and the active layer 115a may each have a lattice constant (e.g., a predetermined lattice constant or selectable lattice constant).

For example, the lattice constant of the substrate 210_1 may be the smallest. The lattice constant of the first semiconductor layer 111a may be the second smallest. The lattice constant of the active layer 115a may be the largest. For example, the lattice constant of the first semiconductor layer 111a may be about 27.47 nm or greater. In some embodiments, the lattice constant of the first semiconductor layer 111a may be in a range of about 27.47 nm to about 31.89 nm. The lattice constant of the active layer 115a may be about 31.89 nm or greater. In some embodiments, the lattice constant of the active layer 115a may be in a range of about 31.89 nm to about 35.40 nm.

In another embodiment, when the first semiconductor layer 111a is formed on the substrate 210_1 and the active layer 115a is formed (or when the undoped semiconductor layer UGL_1 is omitted), a difference in lattice constants may be formed between the active layer 115a and the substrate 210_1. Further, since indium (In) having a relatively large atomic size is disposed in (or is included in) the active layer 115a, the defect density and/or stress inside the active layer 115a may be increased as described above. However, according to the embodiment, the undoped semiconductor layer UGL_1, which is the strain relaxed layer, may be placed between the first semiconductor layer 111a and the active layer 115a and alleviate the difference in lattice constants between the active layer 115a and the substrate 210_1. Thus, an increase of the defect density and/or stress inside the active layer 115a may be prevented. Accordingly, the reduction of luminous efficiency may be prevented.

Figure 11:
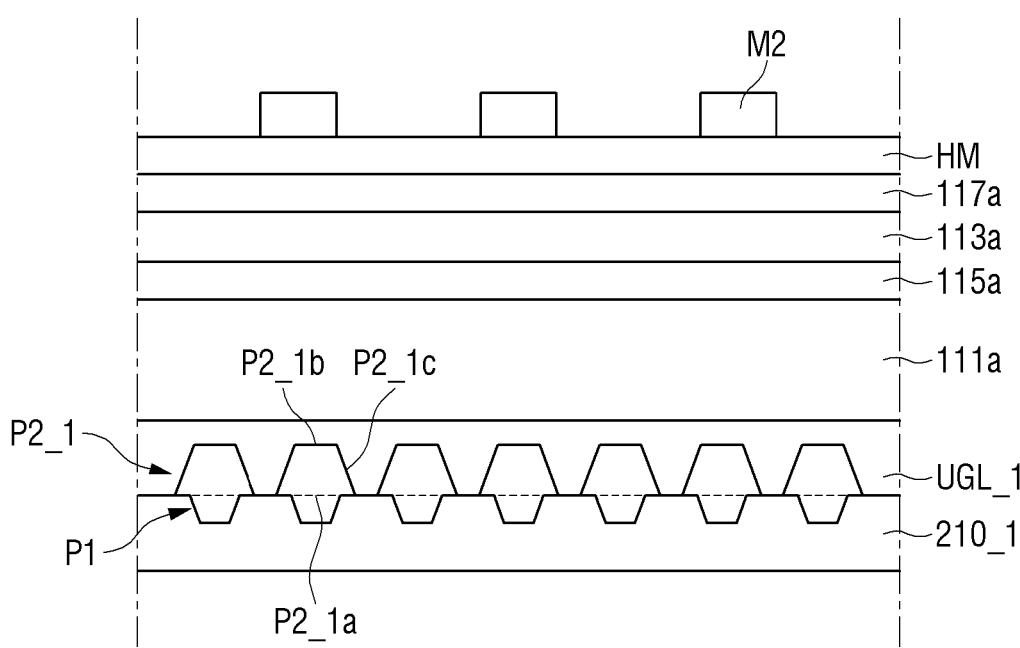

As shown in FIG. 11, a hard mask layer HM may be disposed on the electrode layer 117a. Multiple second mask patterns M2 may be disposed on the hard mask layer HM. The hard mask layer HM may include an organic insulating material or an inorganic insulating material. Examples of the organic insulating material of the hard mask layer HM may include photoresist (PR), and examples of the inorganic insulating material of the hard mask layer HM may include silicon oxide (SiO$_x$) or silicon nitride (SiN$_x$). However, the disclosure is not limited thereto. The second mask patterns M2 may include an organic insulating material or an inorganic insulating material. Examples of the organic insulating material of the second mask patterns M2 may include photoresist (PR), and examples of the inorganic insulating material of the second mask patterns M2 may include silicon oxide (SiO$_x$) or silicon nitride (SiN$_x$). However, the disclosure is not limited thereto. The second mask patterns M2 may be spaced apart from each other.

Figure 12:
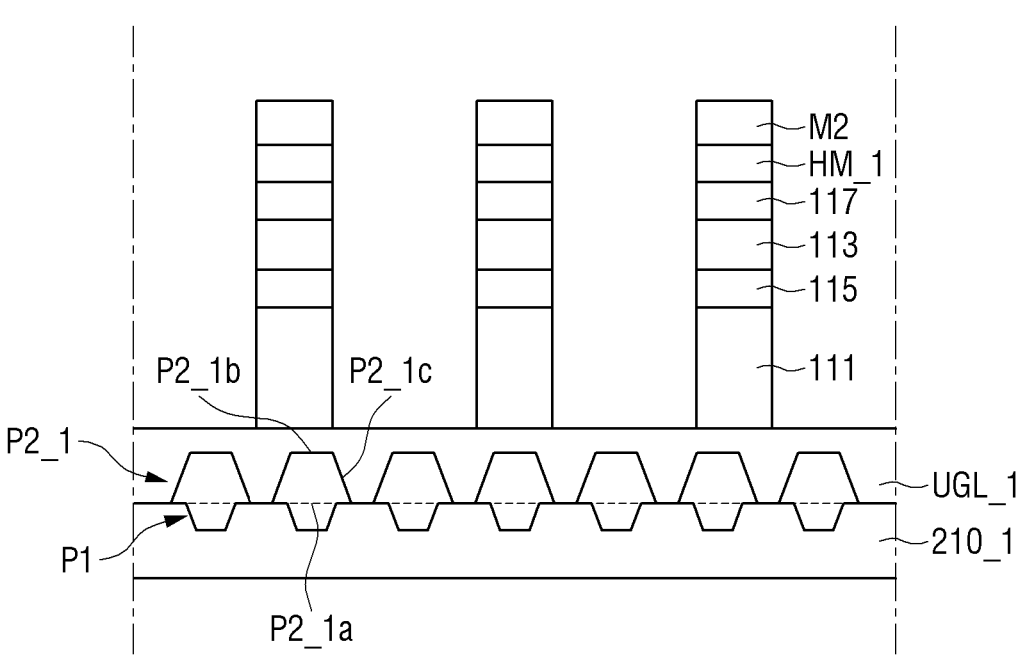

As shown in FIGS. 11 and 12, the hard mask layer HM, the electrode layer 117*a*, the second semiconductor layer 113*a*, the active layer 115*a*, and the first semiconductor layer 111*a* may be etched through the second mask patterns M2 as an etching mask to form hard mask patterns HM_1, the electrode layer 117, the second semiconductor layer 113, the active layer 115, and the first semiconductor layer 111.

Figure 13:
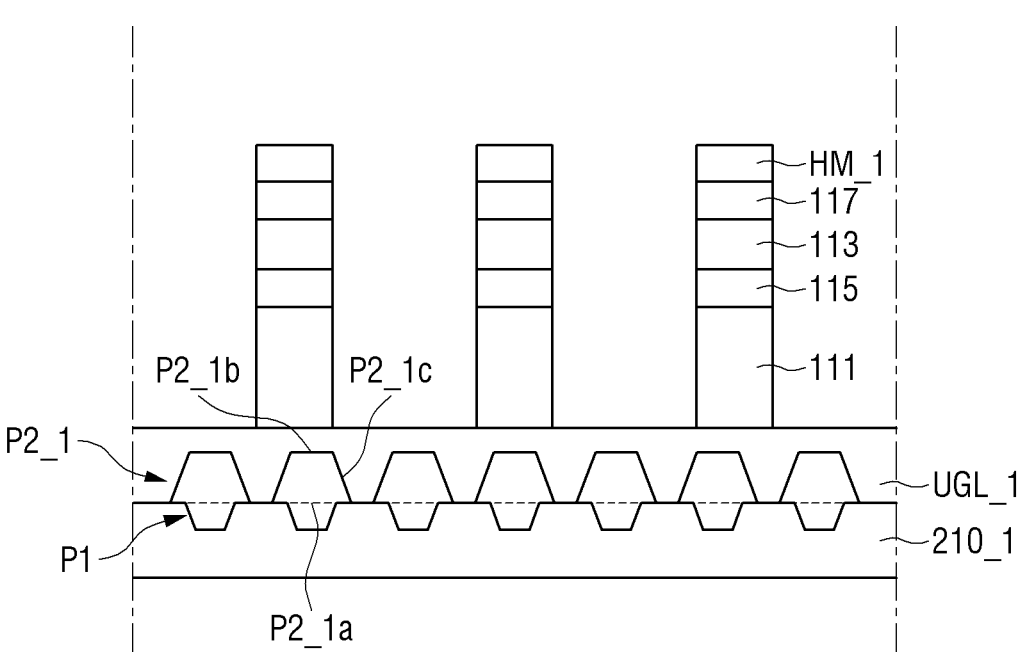

As shown in FIG. 13, the second mask patterns M2 may be removed from the hard mask patterns HM_1.

Figure 14:
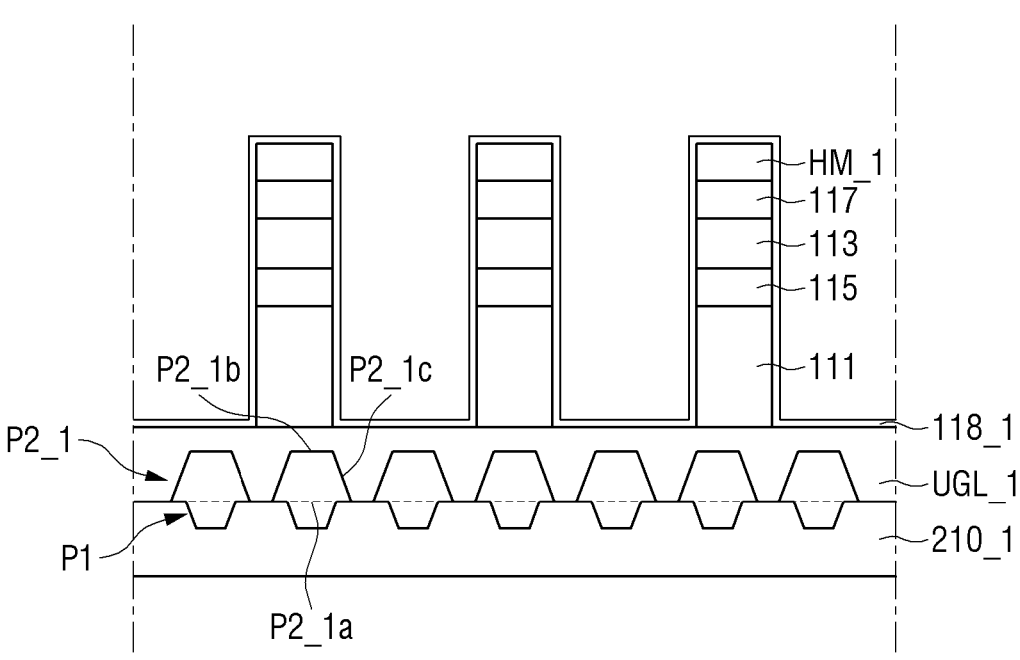

As shown in FIG. 14, an insulating layer 118_1 may be formed. The insulating layer 118_1 may be formed over the whole surface including the undoped semiconductor layer UGL_1, side surfaces of the first semiconductor layer 111, side surfaces of the active layer 115, side surfaces of the second semiconductor layer 113, side surfaces of the electrode layer 117, side surfaces of the hard mask pattern HM_1, and an upper surface of the hard mask pattern HM_1.

Figure 15:
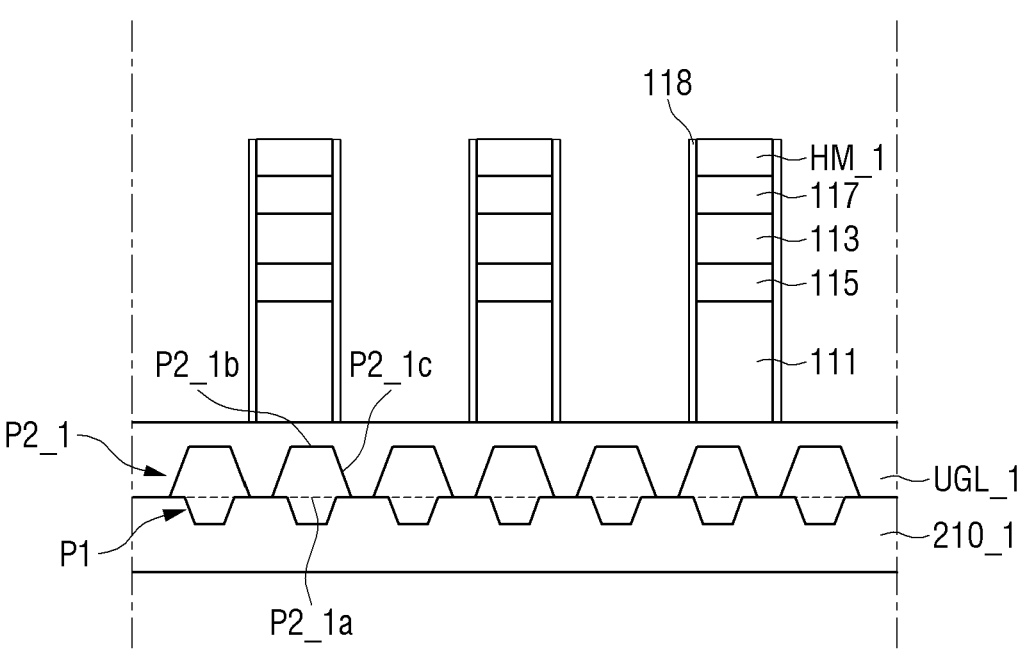

As shown in FIG. 15, the insulating layer 118_1 (e.g., refer to FIG. 14) may be removed except the insulating layer 118 disposed on the side surfaces of the first semiconductor layer 111, the side surfaces of the active layer 115, the side surfaces of the second semiconductor layer 113, the side surfaces of the electrode layer 117, and the side surfaces of the hard mask pattern HM_1. For example, a portion of the insulating layer 118_1, which is disposed on the upper surface of the undoped semiconductor layer UGL_1 and an upper surface of the hard mask pattern HM_1, may be removed.

Figure 16:
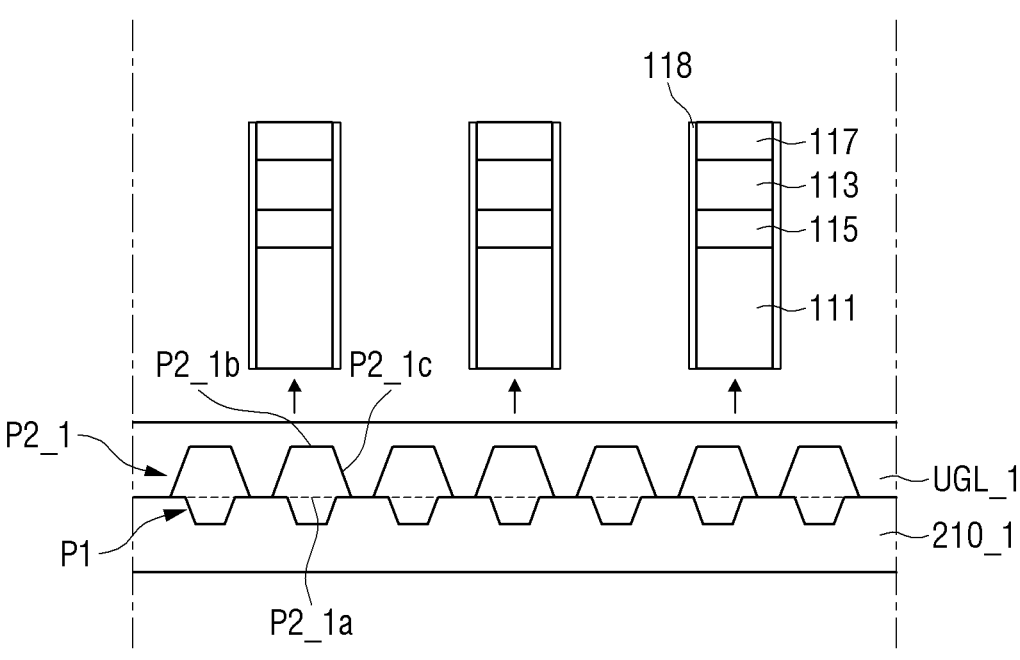

As shown in FIG. 16, light emitting elements ED, each of which includes the first semiconductor layer 111, the active layer 115, the second semiconductor layer 113, the electrode layer 117, and the insulating layer 118, may be peeled off from the undoped semiconductor layer UGL_1. Although not shown, a portion of the insulating layer 118 disposed on the side surfaces of the hard mask patterns HM_1 and the hard mask patterns HM_1 shown in FIG. 15 may also be removed before peeling off the light emitting elements ED of FIG. 16.

Figure 17:
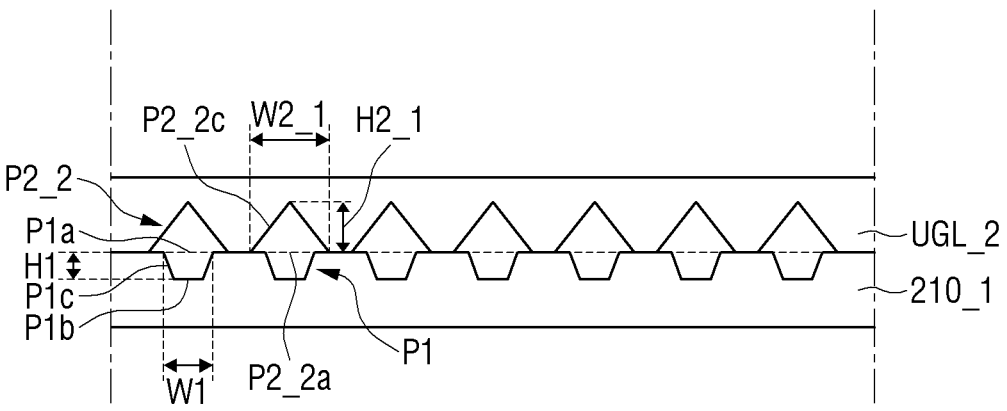
FIG. 17 is a schematic cross-sectional view illustrating a process of manufacturing a light emitting element according to another embodiment.

FIG. 17 is a schematic cross-sectional view illustrating a process of manufacturing a light emitting element according to another embodiment.

Referring to FIG. 17, the method shown in FIG. 17 is different from the method according to the embodiment described above at least in that in the process of etching the undoped semiconductor layer UGL to form the undoped semiconductor layer UGL_1 (or the formed undoped semiconductor layer UGL_1), and the shape of second patterns P2_2 is different from the shape of the second patterns P2_1 of FIG. 9.

A width W2_1 of a fourth surface P2_1*a* of each of the second patterns P2_2 may be greater than a width W1 of a first surface P1*a*, and the second patterns P2_2 may not include the fifth surface P2_*b* of the second pattern P2_1 of FIG. 9. For example, the second pattern P2_2 may have a triangular cross-section.

Similarly to the embodiment described above, an undoped semiconductor layer UGL_2 may be etched by wet etching. An etchant for the wet etching may include potassium hydroxide or tetramethylammonium hydroxide, but is not limited thereto.

Figure 18:
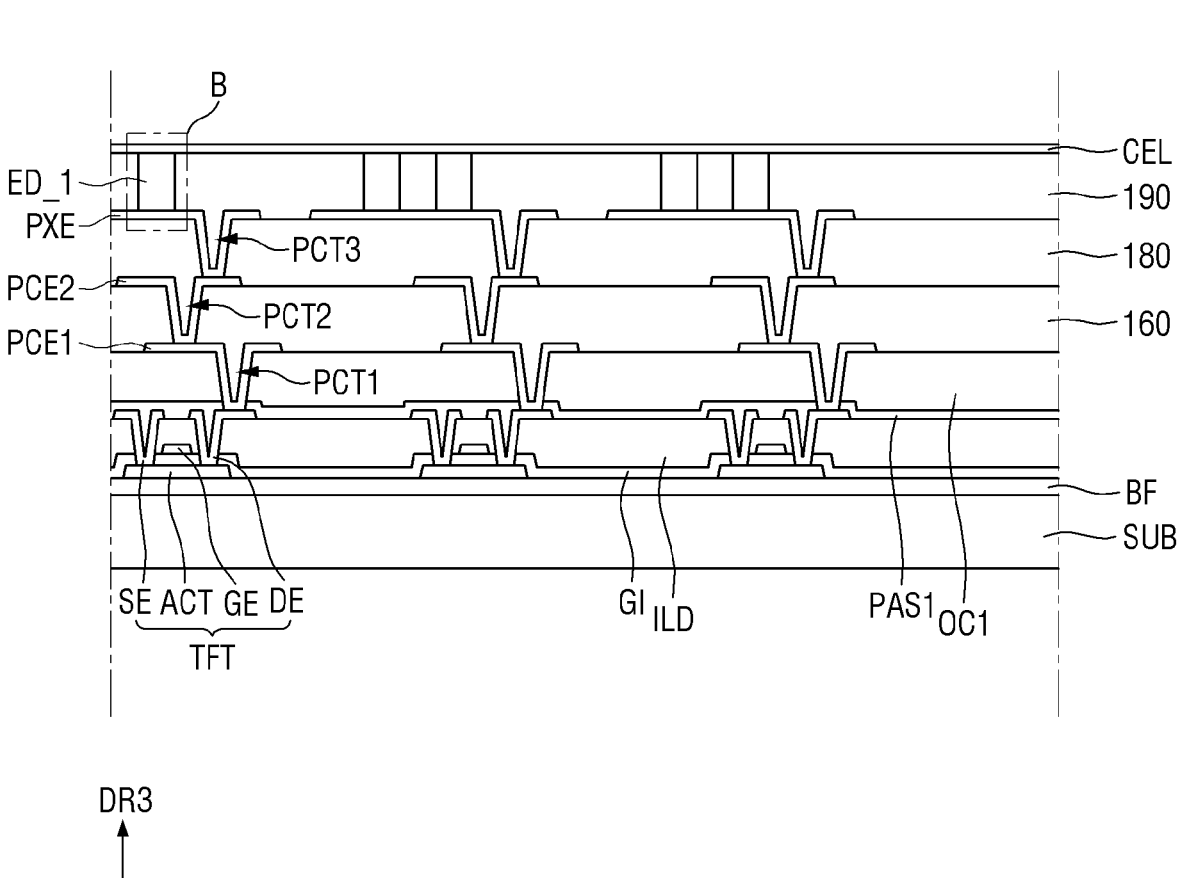
FIG. 18 is a schematic cross-sectional view of a display device according to another embodiment.
Figure 19:
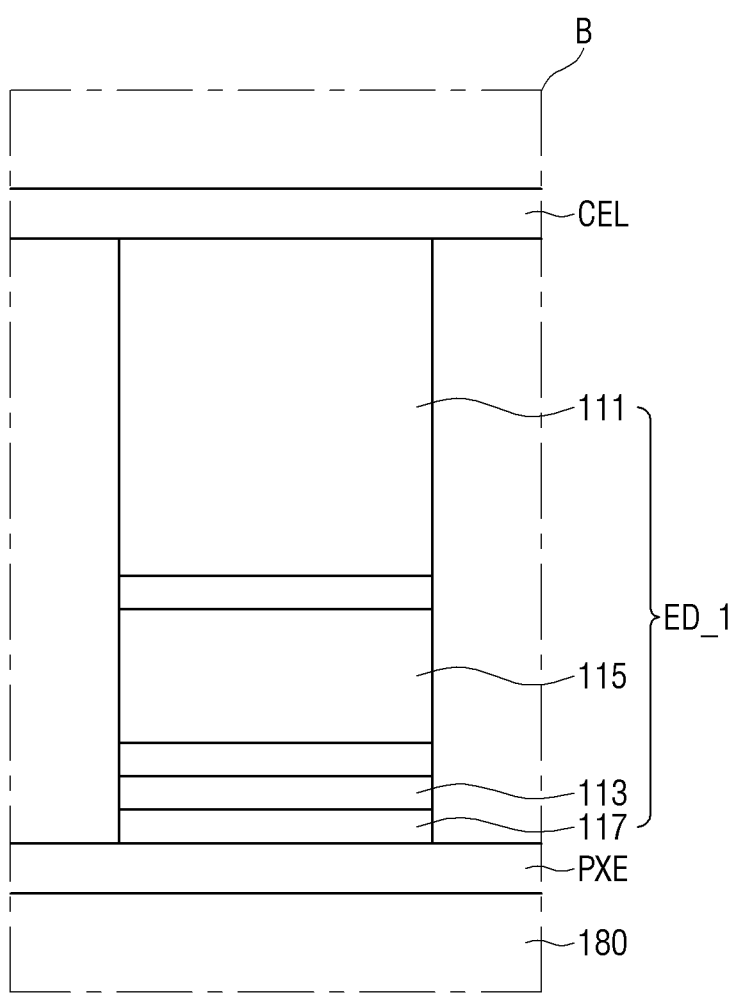
FIG. 19 is a schematic enlarged cross-sectional view of portion B of FIG. 18.

FIG. 18 is a schematic cross-sectional view of a display device according to another embodiment. FIG. 19 is a schematic enlarged cross-sectional view of portion B of FIG. 18.

Referring to FIGS. 18 and 19, a display device 10_1 according to the embodiment may include pixel connection electrodes PCE1 and PCE2, and the arrangement of light emitting elements ED_1 is different from that of the display device 10 of FIG. 2.

For example, a first pixel connection electrode PCE1 may be electrically connected to a drain electrode DE through a first pixel connection hole PCT1 penetrating a first planarization layer OC1. The first pixel connection electrode PCE1 may be made of a single layer or multiple layers including at least one of molybdenum (Mo), aluminum (Al), chromium (Cr), gold (Au), titanium (Ti), nickel (Ni), neodymium (Nd) and copper (Cu). For example, the first pixel connection electrode PCE1 may include an alloy thereof. For example, the first pixel connection electrode PCE1 may include a first layer made of titanium (Ti), a second layer made of aluminum (Al), and a third layer made of titanium (Ti). The second pixel connection electrode PCE2 may be disposed on the first planarization layer OC1. In FIG. 18, the first planarization layer OC1 including an organic material may be disposed on a lower portion of the first pixel connection electrode PCE1. However, the disclosure is not limited thereto. For example, an inorganic layer including an inorganic material may be disposed on the lower portion of the first pixel connection electrode PCE1.

A first organic film 160 may be disposed on the first pixel connection electrode PCE1. The first organic film 160 may be formed as an organic film including at least one of acrylic resin, epoxy resin, phenolic resin, polyamide resin, and polyimide resin. However, the disclosure is not limited thereto.

A second pixel connection electrode PCE2 may be electrically connected to the first pixel connection electrode PCE1 through a second pixel connection hole PCT2 penetrating the first organic film 160. The second pixel connection electrode PCE2 may be made of a single layer or multiple layers including at least one of molybdenum (Mo), aluminum (Al), chromium (Cr), gold (Au), titanium (Ti), nickel (Ni), neodymium (Nd) and copper (Cu). For example, the second pixel connection electrode PCE2 may include an alloy thereof. For example, the second pixel connection electrode PCE2 may include a first layer made of titanium (Ti), a second layer made of aluminum (Al), and a third layer made of titanium (Ti).

A second organic film 180 may be disposed on the second pixel connection electrode PCE2. The second organic film 180 may be formed as an organic film including at least one of acrylic resin, epoxy resin, phenolic resin, polyamide resin, and polyimide resin. However, the disclosure is not limited thereto.

Pixel electrodes PXE may be disposed on the second organic film 180. Each of the pixel electrodes PXE may be electrically connected to the second pixel connection electrode PCE2 through a third pixel connection hole PCT3 penetrating the second organic film 180. Thus, each of the pixel electrodes PXE may be electrically connected to a thin film transistor TFT through the first pixel connection electrode PCE1 and the second pixel connection electrode PCE2. Accordingly, a pixel voltage or an anode voltage controlled by the thin film transistor TFT may be applied to the pixel electrodes PXE.

The pixel electrode PXE may be made of a single layer or multiple layers including at least one of molybdenum (Mo), aluminum (Al), chromium (Cr), gold (Au), titanium (Ti), nickel (Ni), neodymium (Nd) and copper (Cu). For example, the pixel electrode PXE may include an alloy thereof. Since the pixel electrodes PXE serve to bond to the light emitting elements ED_1, the surface resistance of the pixel electrodes PXE may be decreased and the contact resistance between the pixel electrodes PXE and the light emitting elements ED_1 may be reduced. For example, the pixel electrodes PXE may be made of copper (Cu) which has a low surface resistance.

Each of the light emitting elements ED_1 may be disposed on the pixel electrode PXE. Each of the light emitting elements ED_1 may be a vertical micro LED extending in a third direction DR3.

A planarization layer 190 may be disposed on side surfaces of each of the light emitting elements ED_1. The planarization layer 190 may be a layer for planarizing a step difference caused by the light emitting elements ED_1. Upper surfaces of the light emitting elements ED_1 and an upper surface of the planarization layer 190 may be formed into a plane surface. The planarization layer 190 may be formed as an organic film including at least one of acrylic resin, epoxy resin, phenolic resin, polyamide resin, and polyimide resin. However, the disclosure is not limited thereto.

A common electrode layer CEL may be disposed on the upper surfaces of the light emitting elements ED_1 and the upper surface of the planarization layer 190. A common electrode CE may be a common layer electrically connected to the light emitting elements ED_1. The common electrode layer CEL may be made of a transparent conductive material (TCO), such as indium tin oxide (ITO), indium zinc oxide (IZO), or the like.

Figure 20:
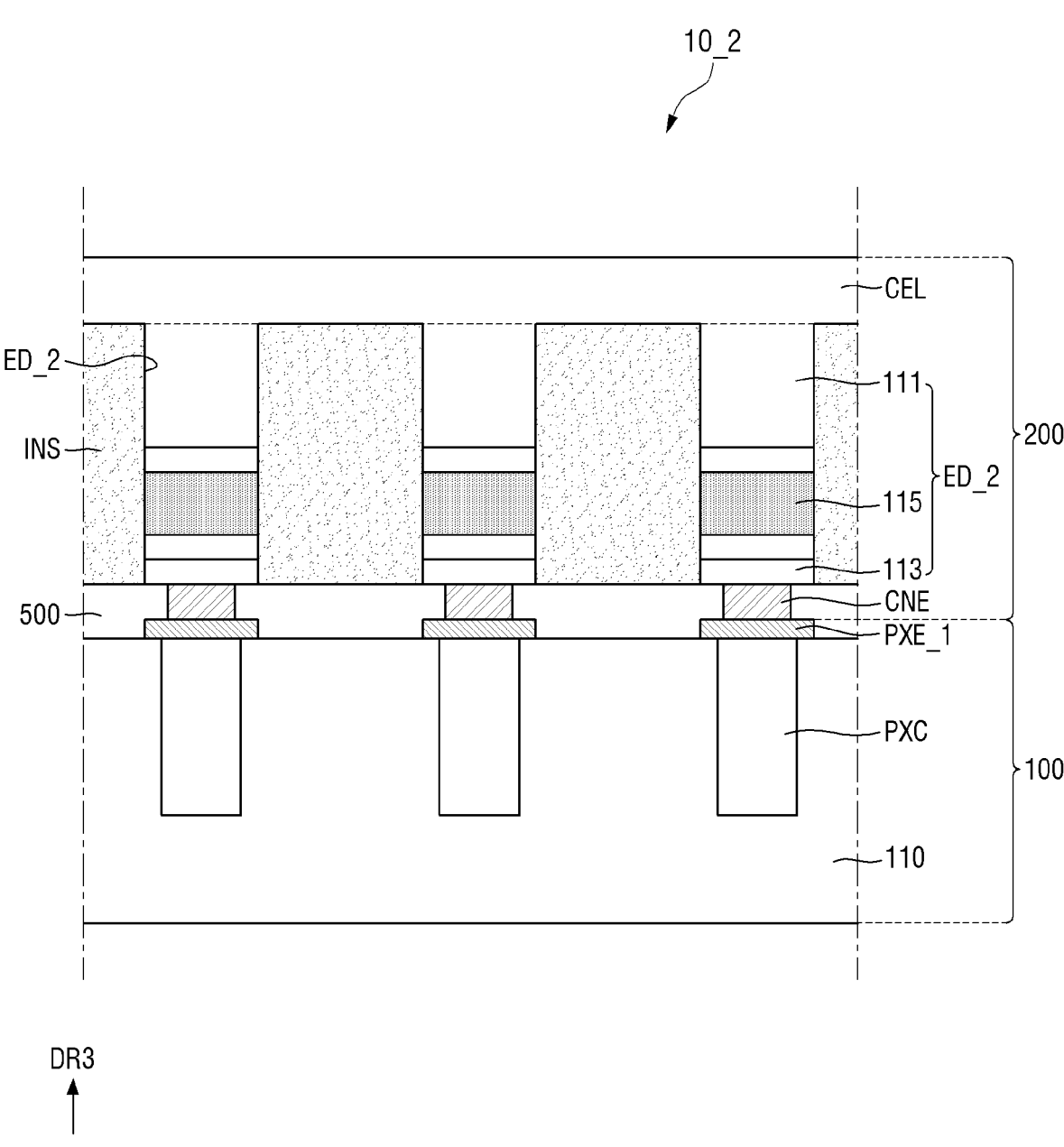
FIG. 20 is a schematic cross-sectional view of a display device according to another embodiment.

FIG. 20 is a schematic cross-sectional view of a display device according to another embodiment.

Referring to FIG. 20, a display device 10_2 according to the embodiment may include a semiconductor circuit board 100 and a display substrate 200.

The semiconductor circuit board 100 may include a first substrate 110, pixel circuit parts PXC, and pixel electrodes PXE_1. The display device 200 may include light emitting elements ED_2, an insulating layer INS, and connection electrodes CNE. Although not shown, the display device 10_2 may further include a filling layer disposed between the semiconductor circuit board 100 and the display substrate 200, and a circuit board.

The first substrate 110 may be a silicon wafer substrate. The first substrate 110 may be made of single-crystalline silicon.

Each of the pixel circuit parts PXC may be disposed on the first substrate 110. Each of the pixel circuit parts PXC may include a complementary metal-oxide semiconductor (CMOS) circuit formed using a semiconductor process. Each of the pixel circuit parts PXC may include at least one transistor formed by a semiconductor process. Each of the pixel circuit parts PXC may include at least one capacitor formed by a semiconductor process.

Each of the pixel circuit parts PXC may be electrically connected to a corresponding pixel electrode PXE_1. For example, the pixel circuit parts PXC and the pixel electrodes PXE_1 may be electrically connected to each other in one-to-one correspondence. Each of the pixel circuit parts PXC may apply an anode voltage to the pixel electrode PXE_1.

Each of the pixel electrodes PXE_1 and the pixel circuit part PXC may be integral with each other, and may be an exposed electrode exposed from the pixel circuit part PXC. For example, each of the pixel electrodes PXE_1 may be exposed from an upper surface of the pixel circuit part PXC. Each of the pixel electrodes PXE_1 may be supplied with a pixel voltage or an anode voltage from the pixel circuit part PXC. The pixel electrodes PXE_1 may include a metal material, such as aluminum (Al). However, the pixel electrodes PXE_1 may have various types.

The display device 200 may include light emitting elements ED_2, an emission defining layer EDL defining the light emitting elements ED_2, and a common electrode layer CEL. The display device 200 may be disposed on the semiconductor circuit board 100. The light emitting elements ED_2 may be disposed corresponding to the pixel electrodes AE of the semiconductor circuit board 100.

The insulating layer INS (or a bank layer or a pixel defining layer) may be disposed between the pixel electrodes PXE_1 of the semiconductor circuit board 100 and the common electrode layer CEL. The insulating layer INS may not overlap the pixel electrodes PXE_1 in a plan view, but may overlap the common electrode layer CEL in a plan view and may be in direct contact with the common electrode layer CEL. The insulating layer INS may include openings that expose the common electrode layer CEL. For example, the insulating layer INS may be adjacent to (e.g., may surround) each of the light emitting elements ED_2 and may be disposed on (e.g., be disposed directly on) side surfaces of each of the light emitting elements ED_2. The light emitting elements ED_2 may be disposed in (or be surrounded by) the insulating layer INS. Because the openings of the insulating layer INS determine a growth area of the light emitting element ED_2, the insulating layer INS and at least one surface of the light emitting element ED_2 may be coplanar with each other. For example, the insulating layer INS and at least one of an upper surface and a lower surface of the light emitting element ED_2 may be coplanar with each other. In the drawing, the insulating layer INS and both the upper and lower surfaces of the light emitting element ED_2 may be coplanar with each other. The insulating layer INS and the light emitting element ED_2 may have a same height.

The insulating layer INS may protect the light emitting elements ED_2 from foreign substances, for example, dust or air, and may electrically insulate the light emitting elements ED_2 from other layers. The insulating layer INS may include at least one inorganic insulating material of silicon nitride ($SiN_x$), silicon oxide ($SiO_x$), silicon oxynitride ($SiO_xN_y$), aluminum oxide ($AlO_y$), and aluminum nitride ($AlN_x$). However, the disclosure is not limited thereto.

The light emitting elements ED_2 may be disposed in the openings of the insulating layer INS, respectively.

Each of the light emitting elements ED_2 may have a shape extending in the third direction DR3 (or in the thickness direction of the first substrate 110).

The common electrode layer CEL described above may be disposed on the insulating layer INS. The common electrode layer CEL may be electrically connected to the first semiconductor layers 111 of the light emitting elements ED_2. The common electrode layer CEL may be formed over the whole surface of the display substrate 200 without being differentiated for the light emitting elements ED_2.

According to the light emitting element, the method of manufacturing a light emitting element, and the method of manufacturing a display device in accordance with the embodiments, strain of the active layer may be reduced.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed:

1. A method of manufacturing a light emitting element, comprising:
   placing a plurality of mask patterns on a substrate;
   forming first patterns on the substrate through the plurality of mask patterns, the first patterns recessed from an upper surface of the substrate;
   forming an undoped semiconductor layer on the substrate on which the first patterns are formed, the undoped semiconductor layer including second patterns recessed from a lower surface of the undoped semiconductor layer, the lower surface of the undoped semiconductor layer facing toward the substrate;
   etching the undoped semiconductor layer including the second patterns;
   forming a first semiconductor layer on the undoped semiconductor layer;
   forming an active layer on the first semiconductor layer;
   forming a second semiconductor layer on the active layer; and
   forming an electrode layer on the second semiconductor layer.

2. The method of claim 1, wherein each of the first patterns includes:
   a first surface coplanar with the upper surface of the substrate;
   a second surface facing the first surface; and
   a third surface extending between the first surface and the second surface.

3. The method of claim 2, wherein a width of the first surface is greater than a width of the second surface.

4. The method of claim 3, wherein each of the second patterns includes:
   a fourth surface coplanar with the lower surface of the undoped semiconductor layer;
   a fifth surface facing the fourth surface; and
   a sixth surface extending between the fourth surface and the fifth surface.

5. The method of claim 4, wherein a width of the fourth surface is greater than a width of the fifth surface.

6. The method of claim 5, wherein the width of the first surface is greater than the width of the fourth surface.

7. The method of claim 6, wherein after the etching of the undoped semiconductor layer, the width of the fourth surface of each of the second patterns is greater than the width of the first surface.

8. The method of claim 7, wherein the fifth surface is removed by the etching of the undoped semiconductor layer.

9. The method of claim 8, wherein the etching of the undoped semiconductor layer is performed by wet etching.

10. The method of claim 9, wherein an etchant for the wet etching includes potassium hydroxide or tetramethylammonium hydroxide.

11. The method of claim 1, wherein
   the undoped semiconductor layer includes GaN, and
   the first semiconductor layer includes n-GaN doped with Si.

12. The method of claim 11, wherein the active layer includes InGaN.

13. The method of claim 12, wherein a lattice constant of the active layer is about 31.89 nm or greater.

14. A method of manufacturing a display device, comprising:
   forming banks spaced apart from each other on a base substrate;
   forming, on the banks, a first electrode and a second electrode spaced apart from each other and overlapping the banks in a plan view;
   placing a light emitting element between the first electrode and the second electrode; and
   manufacturing the light emitting element, the manufacturing of the light emitting element includes:
      placing a plurality of mask patterns on a substrate;
      forming first patterns on the substrate through the plurality of mask patterns, the first patterns recessed from an upper surface of the substrate;
      forming an undoped semiconductor layer including second patterns recessed from a lower surface of the undoped semiconductor layer on the substrate on which the first patterns are formed;
      etching the undoped semiconductor layer including the second patterns;
      forming a first semiconductor layer on the undoped semiconductor layer;
      forming an active layer on the first semiconductor layer;
      forming a second semiconductor layer on the active layer; and
      forming an electrode layer on the second semiconductor layer.

15. The method of claim 14, wherein the manufacturing of the light emitting element further comprises:
   placing a second mask pattern on the electrode layer; and
   etching the electrode layer, the second semiconductor layer, the active layer, and the first semiconductor layer through the second mask pattern.

16. The method of claim 15, wherein the manufacturing of the light emitting element further comprises:
   after the etching of the electrode layer, the second semiconductor layer, the active layer, and the first semiconductor layer through the second mask pattern, forming an insulating layer on side surfaces of the electrode layer, the second semiconductor layer, the active layer, and the first semiconductor layer.

17. The method of claim 14, wherein the etching of the undoped semiconductor layer is performed by wet etching.

18. The method of claim 17, wherein an etchant for the wet etching includes potassium hydroxide or tetramethyl-ammonium hydroxide.

19. The method of claim 14, wherein
   the undoped semiconductor layer includes GaN,
   the first semiconductor layer includes n-GaN doped with Si,
   the active layer includes InGaN, and a lattice constant of the active layer is about 31.89 nm or greater.

* * * * *